United States Patent
Zhang

(10) Patent No.: US 11,935,862 B2
(45) Date of Patent: Mar. 19, 2024

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventor: Kun Zhang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 450 days.

(21) Appl. No.: 17/354,969

(22) Filed: Jun. 22, 2021

(65) Prior Publication Data
US 2022/0392864 A1 Dec. 8, 2022

Related U.S. Application Data

(63) Continuation of application No. PCT/CN2021/098517, filed on Jun. 7, 2021.

(51) Int. Cl.
*H01L 25/18* (2023.01)
*H01L 23/00* (2006.01)
(Continued)

(52) U.S. Cl.
CPC ............ *H01L 24/32* (2013.01); *H01L 23/481* (2013.01); *H01L 24/83* (2013.01);
(Continued)

(58) Field of Classification Search
CPC ....... H01L 24/32; H01L 23/481; H01L 24/83; H01L 25/0657; H01L 25/18; H01L 25/50;
(Continued)

(56) References Cited

U.S. PATENT DOCUMENTS

| 6,171,931 B1 | 1/2001 | Murari et al. |
| 10,283,493 B1 * | 5/2019 | Nishida .................. H10B 43/27 |

(Continued)

FOREIGN PATENT DOCUMENTS

| CN | 1412835 A | 4/2003 |
| CN | 101232026 A | 7/2008 |

(Continued)

OTHER PUBLICATIONS

International Search Report issued in corresponding International Application No. PCT/CN2021/098517, dated Mar. 2, 2022, 5 pages.

*Primary Examiner* — Earl N Taylor
(74) *Attorney, Agent, or Firm* — BAYES PLLC

(57) ABSTRACT

Three-dimensional (3D) memory devices and methods for forming the same are disclosed. In certain aspects, a 3D memory device includes a first semiconductor structure, a second semiconductor structure opposite to the first semiconductor structure, and an interface layer between the first semiconductor structure and the second semiconductor structure. The first semiconductor structure includes a memory stack having a plurality of interleaved stack conductive layers and stack dielectric layers. The second semiconductor structure includes a plurality of peripheral circuits electrically connected to the memory stack. The interface layer includes single crystalline silicon and a plurality of interconnects between the memory stack and the peripheral circuits.

20 Claims, 10 Drawing Sheets

(51) Int. Cl.
*H01L 23/48* (2006.01)
*H01L 25/00* (2006.01)
*H01L 25/065* (2023.01)
*H10B 43/27* (2023.01)
*H10B 43/40* (2023.01)
*H10B 43/50* (2023.01)
*H10B 80/00* (2023.01)

(52) U.S. Cl.
CPC .......... *H01L 25/0657* (2013.01); *H01L 25/18* (2013.01); *H01L 25/50* (2013.01); *H10B 43/27* (2023.02); *H10B 43/40* (2023.02); *H10B 43/50* (2023.02); *H10B 80/00* (2023.02); *H01L 2224/32145* (2013.01); *H01L 2224/83005* (2013.01); *H01L 2224/83895* (2013.01); *H01L 2224/83896* (2013.01); *H01L 2225/06541* (2013.01); *H01L 2924/1431* (2013.01); *H01L 2924/14511* (2013.01)

(58) Field of Classification Search
CPC . H01L 2224/32145; H01L 2224/83005; H01L 2224/83895; H01L 2224/83896; H01L 2225/06541; H01L 2924/1431; H01L 2924/14511; H10B 43/27; H10B 43/40; H10B 43/50; H10B 80/00
See application file for complete search history.

(56) References Cited

U.S. PATENT DOCUMENTS

| | | | | |
|---|---|---|---|---|
| 10,629,616 | B1* | 4/2020 | Kai | H10B 43/10 |
| 10,868,025 | B2* | 12/2020 | Zhou | H10B 43/40 |
| 11,302,700 | B2* | 4/2022 | Cheng | H10B 41/40 |
| 11,721,668 | B2* | 8/2023 | Liu | H01L 25/0657 |
| | | | | 257/777 |
| 2015/0235949 | A1 | 8/2015 | Yu et al. | |
| 2016/0336338 | A1 | 11/2016 | Song et al. | |
| 2017/0373084 | A1 | 12/2017 | Shim et al. | |
| 2020/0227397 | A1* | 7/2020 | Yada | H10B 43/40 |
| 2020/0286875 | A1* | 9/2020 | Nishida | H01L 25/50 |
| 2020/0328176 | A1* | 10/2020 | Liu | H10B 41/41 |
| 2020/0350321 | A1* | 11/2020 | Cheng | H01L 27/0688 |
| 2021/0035965 | A1* | 2/2021 | Mizutani | H01L 25/18 |
| 2022/0020712 | A1* | 1/2022 | Wang | H10B 41/50 |
| 2022/0068882 | A1* | 3/2022 | Xiao | H01L 24/05 |

FOREIGN PATENT DOCUMENTS

| | | |
|---|---|---|
| CN | 102034829 A | 4/2011 |
| CN | 102386126 A | 3/2012 |
| CN | 107968050 A | 4/2018 |
| CN | 109075170 A | 12/2018 |
| CN | 110896668 A | 3/2020 |
| CN | 110896669 A | 3/2020 |
| CN | 110914991 A | 3/2020 |
| CN | 111937148 A | 11/2020 |

\* cited by examiner

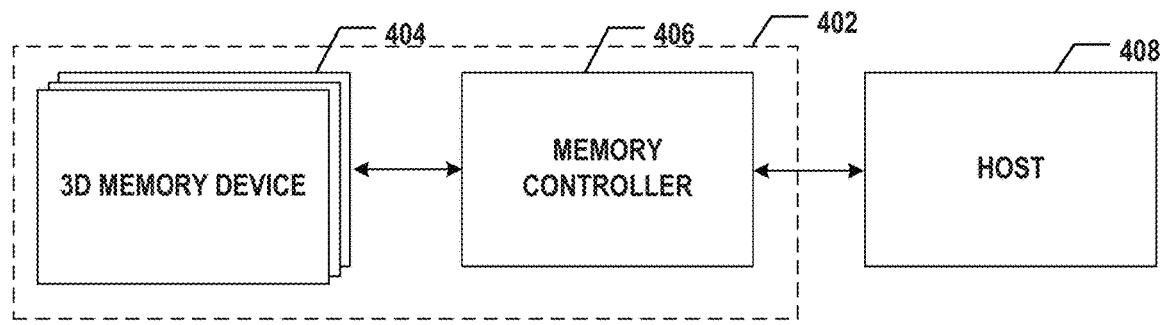
FIG. 4
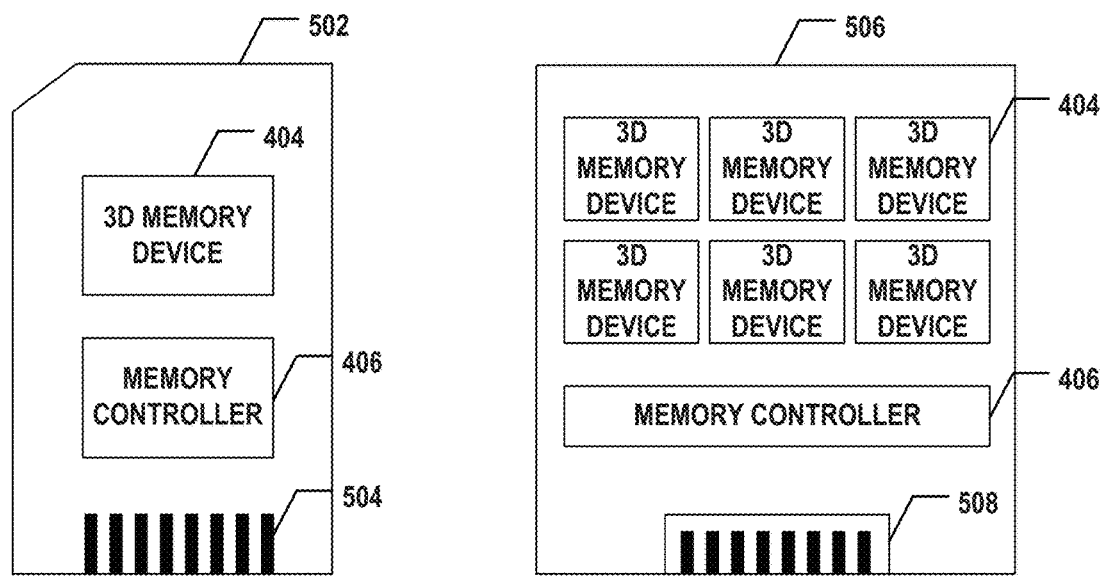
FIG. 5A
FIG. 5B

THREE-DIMENSIONAL MEMORY DEVICES AND METHODS FOR FORMING THE SAME

CROSS-REFERENCE TO RELATED APPLICATIONS

This application is continuation of International Application No. PCT/CN2021/098517, filed on Jun. 7, 2021, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY 3D memory devices and fabrication methods thereof are disclosed herein.

In one aspect, a 3D memory device includes a first semiconductor structure, a second semiconductor structure opposite to the first semiconductor structure, and an interface layer between the first semiconductor structure and the second semiconductor structure. The first semiconductor structure includes a memory stack having a plurality of interleaved stack conductive layers and stack dielectric layers. The second semiconductor structure includes a plurality of peripheral circuits electrically connected to the memory stack. The interface layer includes single crystalline silicon and a plurality of interconnects between the memory stack and the peripheral circuits.

In still another aspect, a method for forming a 3D memory device is provided. A semiconductor substrate having a carrier substrate, a stop layer, and a filling layer is provided. A memory stack and a plurality of channel structures extending through the memory stack are formed in the semiconductor substrate. Each channel structure includes a memory film, a semiconductor channel, and a channel plug. An interface layer is formed over the semiconductor substrate. The interface layer includes single crystalline silicon. A plurality of peripheral circuits are formed over the interface layer. The peripheral circuits are electrically connected to the memory stack. A support substrate is bonded to the semiconductor substrate from a first side. The carrier substrate is removed from a second side of the semiconductor substrate to expose a surface. The second side is opposite to the first side. An interconnect layer is formed on the exposed surface.

In yet another aspect, a system includes a 3D memory device configured to store data and a memory controller control the 3D memory device. The 3D memory device includes a first semiconductor structure, a second semiconductor structure opposite to the first semiconductor structure, and an interface layer between the first semiconductor structure and the second semiconductor structure. The first semiconductor structure includes a memory stack having a plurality of interleaved stack conductive layers and stack dielectric layers. The second semiconductor structure includes a plurality of peripheral circuits electrically connected to the memory stack. The interface layer includes single crystalline silicon and a plurality of interconnects between the memory stack and the peripheral circuits.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 4 illustrates a block diagram of an exemplary system having a 3D memory device, according to some aspects of the present disclosure.

FIG. 5A illustrates a diagram of an exemplary memory card having a 3D memory device, according to some aspects of the present disclosure.

FIG. 5B illustrates a diagram of an exemplary solid-state drive (SSD) having a 3D memory device, according to some aspects of the present disclosure.

Figure 1:
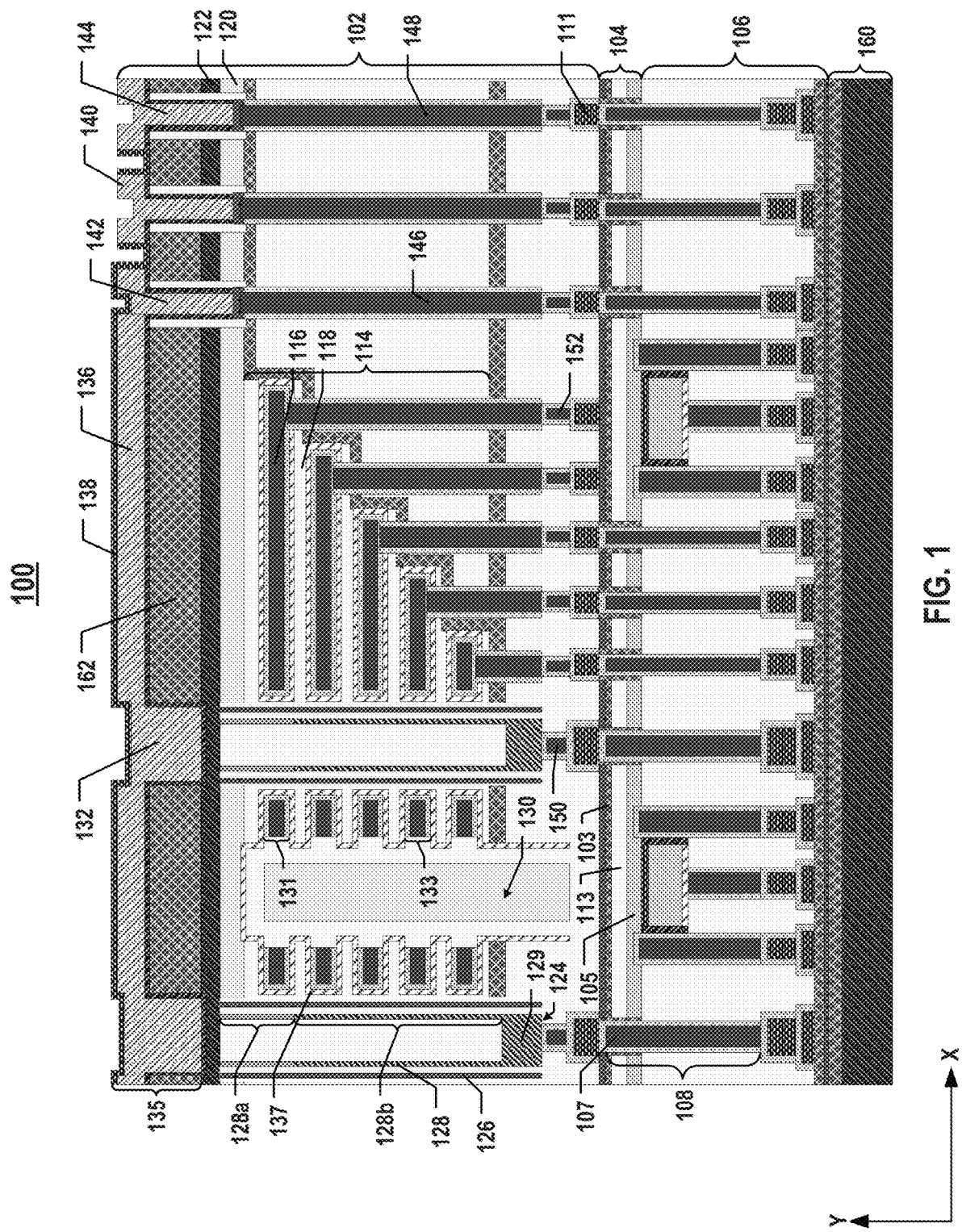
FIG. 1 illustrates a side view of a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent or entirety of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some 3D NAND memory devices, to increase the storage capacity per unit area of such devices, semiconductor designers may choose one or more approaches, such as increasing the storage capacity of each memory cell, adding levels to a semiconductor structure of the device, increasing the number of cells by shrinking the size of each memory cell, etc. These approaches may be accompanied by a myriad of manufacturing difficulties. For example, when the semiconductor structure has too many levels, the fabrication process becomes more complicated as the etching depth increases and the rounds of deposition of materials for those levels also increase. The internal mechanical stress, especially that at the bottom of the semiconductor structure (e.g., the silicon substrate supporting the upper array of electrical components), also becomes nonnegligible as a result of the piling up of the multiple layers of materials. The stress may cause bowing, bending, or deformation of the wafer on which the memory devices are created, thus rendering the wafer too fragile to be further fabricated on a machine platform. Moreover, the need for more transistors in the semiconductor structure becomes more acute as the level of the semiconductor structure increases. This poses a dilemma as the size of the transistors cannot unlimitedly be reduced, because the high thermal conductivity of smaller transistors during the fabrication of the semiconductor structure may affect the short channel effect of the other semiconductor structure adjacent thereto.

To address the aforementioned issues, the present disclosure introduces a solution in which a second semiconductor structure including peripheral circuits is formed over a first semiconductor structure including a memory stack, with an interface layer between the two structures. The interface layer includes single crystalline silicon and a plurality of interconnects between the memory stack and the peripheral circuits. Therefore, the high thermal impact from the first semiconductor structure towards the second semiconductor is reduced. As a result, the electric performance of the 3D memory devices can be improved.

FIG. 1 illustrates a side view of a cross-section of an exemplary 3D memory device 100, according to some aspects of the present disclosure. In some implementations, 3D memory device 100 is a single chip including a first semiconductor structure 102 and a second semiconductor structure 106 formed after the formation of and adjacent to first semiconductor structure 102. An interface layer 104 is disposed between semiconductor structures 102 and 106, according to some implementations. In some implementations, as shown in FIG. 1, a support substrate 160 is added to second semiconductor structure 106 towards the end of the fabrication, which may serve to enhance the structural rigidity and support the entire device. Support substrate 160 may be attached to the side of second semiconductor structure 106 facing away from interface layer 104, which is the side on the bottom of second semiconductor structure 106 shown in FIG. 1. Support substrate 160 may have a thickness of at least 300 µm. Thus, 3D memory device 100 is not susceptible to bending or peeling due to the internal stress. In other implementations, semiconductor structure 102 in the final product may be dispensed with a substrate, which may be removed during the fabrication of 3D memory device 100.

Semiconductor structure 106 of 3D memory device 100 can include a plurality of peripheral circuits 108. It is noted that x and y axes are included in FIG. 1 to further illustrate the spatial relationship of the components in 3D memory device 100 having semiconductor structures 102 and 106. 3D memory device 100 includes two lateral surfaces (e.g., a top surface and a bottom surface) extending laterally in the x-direction (i.e., the lateral direction). As used herein, whether one component (e.g., a layer or a device) is on, above, or below another component (e.g., a layer or a device) of a semiconductor device (e.g., 3D memory device 100) is determined relative to the semiconductor structure with peripheral circuits (e.g., semiconductor structure 106) of the semiconductor device in the y-direction (i.e., the vertical direction) when the semiconductor structure is positioned in the lowest plane of the semiconductor device in the y-direction. The same notion for describing spatial relationships is applied throughout the present disclosure, unless otherwise specified.

In some implementations, peripheral circuits 108 are configured to control and sense the electrical signals from 3D memory device 100. Peripheral circuits 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed on semiconductor structure 106, in which the entirety or part of the transistors are formed in semiconductor structure 106 (e.g., with one end above the top surface of semiconductor structure 106 and penetrating into interface layer 104) and/or directly on semiconductor structure 106. Isolation regions (e.g., shallow trench isolations (STIs)) and doped regions (e.g., source regions and drain regions of the transistors) can be formed in semiconductor structure 102 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral circuits 108 may further include any other circuits compatible with the advanced logic processes including logic circuits, such as processors and programmable logic devices (PLDs), or memory circuits, such as static random-access memory (SRAM) and dynamic RAM (DRAM).

As shown in FIG. 1, 3D memory device 100 may further include an interface layer 104 between semiconductor structures 102 and 106. In some implementations, interface layer 104 may include a single crystalline silicon layer 105, a carbon-doped silicon nitride layer 113, an insulation layer 103, etc. Single crystalline silicon layer 105 may be formed in contact with semiconductor structure 106 via a surface that is opposite to the surface on which support substrate 160 is in contact with semiconductor structure 106. Carbo-doped nitride layer 113 and insulation layer 103 may be sequentially stacked above single crystalline silicon layer 105.

As described in detail below, in some implementations, single crystalline silicon layer 105 is peeled off from a silicon wafer (e.g., silicon-on-insulator (SOI)) and attached (e.g., bonded) onto insulation layer 103. Carbon-doped silicon nitride layer 113 may be formed by doping carbon into a silicon nitride layer during the fabrication of back-end-of-line (BEOL) interconnects, which may serve as an etch stop layer. Insulation layer 103 may include one or more dielectric layers, which may be made of dielectric materials, including, but not limited to, silicon oxide, silicon nitride, silicon oxynitride, low dielectric constant (low-k) dielectrics, or any combination thereof. Single crystalline silicon layer 105 may include single crystalline silicon (a.k.a. monocrystalline silicon). The use of single crystalline silicon allows easy formation of semiconductor structure 106 after forming semiconductor structure 102 and interface layer 104. Also, compared with polysilicon, single crystalline silicon has a higher carrier mobility to achieve better device performance. Interface layer 104 may further reduce the high thermal impact from semiconductor structure 102 to the transistors of peripheral circuits 108 in semiconductor structure 106. The thickness of interface layer 104 may be between 50 nm and 10 μm. In some specific applications, interface layer 104 may have a thickness of 1 μm to 10 μm, which may provide structural support to 3D memory device 100 that would reduce bending or peeling of the chip despite the piling up of internal stress.

According to the present disclosure, interface layer 104 may include a plurality of interconnects 107 (also referred to herein as contacts) that transfer electrical signals between semiconductor structures 102 and 106. In some implementations, as shown in FIG. 1, interconnects 107 may be the portion of peripheral circuits 108 that penetrate into interface layer 104. In other words, the upper end of interconnects 107 may be between the upper surface and lower surface of interface layer 104. Interconnects 107 may be formed across insulation layer 103, carbon-doped silicon nitride layer 113 and single crystalline silicon layer 105. In some implementations, interconnects 107 may be vertical interconnect access (VIA) contacts. Such interconnects can broadly include any suitable types of interconnects, such as middle-end-of-line (MEOL) interconnects and back-end-of-line (BEOL) interconnects. In some other implementations, especially where interface layer 104 has a large thickness, interconnects 107 may be through-silicon via (TSV) type of contacts. TSV contacts may provide electrical connection between components of heterogenous materials, such as combining peripheral circuits with memory cells. The VIA contacts and the TSV contacts in interface layer 104 can include conductive materials including, but not limited to, tungsten (W), cobalt (Co), copper (Cu), aluminum (Al), silicides, or any combination thereof.

As described below in detail, second semiconductor structure 106 can be formed directly over first semiconductor structure 102 and interface layer 104, instead of being bonded with them. In some implementations, first semiconductor structure 102 of 3D memory device 100 further includes a plurality of interface contacts 111, such as MEOL contacts and/or BEOL contacts, at a surface of first semiconductor structure 102 close to interface layer 104. Interface contacts 111 can include conductive materials including, but not limited to W, Co, Cu, Al, silicides, or any combination thereof. Interconnects 107 are provided in interface layer 104 at locations corresponding to interface contacts 111 of first semiconductor structure 102 and peripheral circuits 108 of second semiconductor structure 106 to enable transmission of electrical signals between these two semiconductor structures.

In some implementations, 3D memory device 100 is a NAND Flash memory device in which memory cells are provided in the form of an array of NAND memory strings. Each NAND memory string can include a respective channel structure 124. As shown in FIG. 1, each channel structure 124 can extend vertically through a plurality of pairs each including a stack conductive layer 116 and a stack dielectric layer 118. The interleaved stack conductive layers 116 and stack dielectric layers 118 are part of a memory stack 114. The number of the pairs of stack conductive layers 116 and stack dielectric layers 118 in memory stack 114 determines the number of memory cells in 3D memory device 100. It is understood that in some implementations, memory stack 114 may have a multi-deck architecture (not shown), which includes a plurality of memory decks stacked over one another. The numbers of the pairs of stack conductive layers 116 and stack dielectric layers 118 in each memory deck can be the same or different.

Memory stack 114 can include a plurality of interleaved stack conductive layers 116 and stack dielectric layers 118. Stack conductive layers 116 and stack dielectric layers 118 in memory stack 114 can alternate in the vertical direction. In other words, except the ones at the top or bottom of memory stack 114, each stack conductive layer 116 can be adjoined by two stack dielectric layers 118 on both sides, and each stack dielectric layer 118 can be adjoined by two stack conductive layers 116 on both sides. Stack conductive layers 116 can include conductive materials including, but not limited to, W, Co, Cu, Al, polysilicon, doped silicon, silicides, or any combination thereof. Each stack conductive layer 116 can include a gate electrode (gate line) surrounded by an adhesive layer and a gate dielectric layer 137. The gate electrode of stack conductive layer 116 can extend laterally as a word line, ending at one or more staircase structures of memory stack 114. Stack dielectric layers 118 can include dielectric materials including, but not limited to, silicon oxide, silicon nitride, silicon oxynitride, or any combination thereof.

As shown in FIG. 1, first semiconductor structure 102 of 3D memory device 100 can also include a filling layer 120 above memory stack 114. Filling layer 120 can include polysilicon, a high dielectric constant (high-k) dielectric, or a metal. For example, a high-k dielectric may include any dielectric materials having a dielectric constant higher than that of silicon oxide (e.g., >3.7). Different from some known solutions in which filling layer 120 acts as the sidewall SEGs surrounding channel structures 124 and/or a conductive layer electrically connecting channel structures 124, such as a doped polysilicon layer, filling layer 120 in first semiconductor structure 102 of 3D memory device 100 may not work as the sidewall SEGs and/or the conductive layer and thus, may include materials other than doped polysilicon, such as dielectrics (e.g., high-k dielectrics), metals (e.g., W, Co, Cu, or Al), metal silicides, or undoped polysilicon. It is understood that in some examples, filling layer 120 may include doped polysilicon as well.

In some implementations, each channel structure 124 includes a channel hole filled with a semiconductor layer (e.g., as a semiconductor channel 128) and a composite dielectric layer (e.g., as a memory film 126). In some implementations, semiconductor channel 128 includes silicon, such as amorphous silicon, polysilicon, or single crystalline silicon. In some implementations, memory film 126 is a composite layer including a tunneling layer, a storage layer (also known as a "charge trap layer"), and a blocking layer. The remaining space of the channel hole can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some implementations, channel structure 124 further includes a channel plug 129 in the bottom portion (e.g., at the lower end) of channel structure 124. As used herein, the upper end of a component (e.g., channel structure 124) is the end farther away from second semiconductor structure 106 in the y-direction, and the lower end of the component (e.g., channel structure 124) is the end closer to second semiconductor structure 106 in they-direction when second semiconductor structure 106 is positioned in the lowest plane of 3D memory device 100 as shown in FIG. 1. Channel plug 129 can include semiconductor materials (e.g., polysilicon). In some implementations, channel plug 129 functions as the drain of channel structure 124.

As shown in FIG. 1, each channel structure 124 can extend vertically through interleaved stack conductive layers 116 and stack dielectric layers 118 of memory stack 114 into filling layer 120. The upper end of memory film 126 may be flush with the upper end of semiconductor channel 128 in the horizontal direction, as shown in FIG. 1. Although not shown, it is understood that in some examples, the upper end of memory film 126 may be between the top surface and bottom surface of filling layer 120. That is, the upper end of memory film 126 can be flush with or exceeds the top surface of memory stack 114. In some implementations, the upper end of memory film 126 is not below the top surface of memory stack 114. The upper end of semiconductor channel 128 is above the upper end of memory film 126, according to some implementations. In other words, semiconductor channel 128 can extend further into filling layer 120 than memory film 126.

In some implementations, semiconductor channel 128 can include a doped portion 128a and an undoped portion 128b. It is understood that one or more of stack conductive layers 116 that are close to filling layer 120 may be source select gate 131 (SSG, sometimes referred to as bottom select gate (BSG)), and the rest of stack conductive layer 116 may include word lines 133. In some implementations, the one or more source select gates 131 laterally face doped portion 128a. As shown in FIG. 1, doped portion 128a of semiconductor channel 128 is positioned further away from interface layer 104 than channel plug 129 and also extend beyond a source select gate 131 that is closest to filling layer 120, according to some implementations. It is understood that if first semiconductor structure 102 of 3D memory device 100 includes more than one source select gate 131, doped portion 128a may extend beyond all source select gates 131. On the other hand, doped portion 128a may not extend further to face word lines 133. That is, the lower end of doped portion 128a is between source select gates 131 and word lines 133 in the vertical direction, according to some implementations.

In some implementations, doped portion 128a of semiconductor channel 128 includes N-type doped polysilicon. The dopant can be any suitable N-type dopants, such as phosphorus (P), arsenic (Ar), or antimony (Sb), which contribute free electrons and increase the conductivity of the intrinsic semiconductor. In some implementations, the doping concentration of doped portion 128a is between about $10^{19}$ cm$^{-3}$ and about $10^{21}$ cm$^{-3}$, such as between $10^{19}$ cm$^{-3}$ and $10^{21}$ cm$^{-3}$ (e.g. $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ cm$^{-3}$, $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ cm$^{-3}$, $10^{21}$ cm$^{-3}$, any range bounded by the lower end by any of these values, or in any range defined by any two of these values). The doping concentrations of doped portion 128a disclosed herein can significantly reduce the contact resistance between semiconductor channel 128 and doped semiconductor layer 122 compared with intrinsic semiconductors. It is understood that in some examples, the diffusion of the dopant may be confined in doped portion 128a of semiconductor channel 128, such that the rest of semiconductor channel 128, i.e., the part that faces word lines 133, is undoped portion 128b that still includes intrinsic semiconductor, such as intrinsic polysilicon (i.e., the doping concentration is nominally zero). The doping concentration profile described above can reduce the potential barrier, the contact resistance, and the sheet resistance at doped portion 128a of semiconductor channel 128, which makes electrical connections for the source of the corresponding NAND memory string, without altering the intrinsic nature of undoped portion 128b of semiconductor channel 128 that forms the memory cells of the NAND memory string.

In some implementations, first semiconductor structure 102 further includes a doped semiconductor layer 122 that can electrically connect multiple channel structures 124. For example, doped semiconductor layer 122 may provide electrical connections between the sources of an array of NAND memory strings in the same block, i.e., the array common source (ACS), with or without filling layer 120 (depending on whether filling layer 120 is conductive or not). In other words, filling layer 120 may not have to include conductive materials, such as metals or doped polysilicon, as doped semiconductor layer 122 alone can electrically connect the sources of multiple NAND memory strings. As a result, the material and dimension constraints on filling layer 120 can be relaxed.

As shown in FIG. 1, channel structure 124 can extend through memory stack 114 and filling layer 120 to doped semiconductor layer 122. In some implementations, at least part of semiconductor channel 128 that is between doped semiconductor layer 122 and source select gate(s) 131 (e.g., one of stack conductive layers 116 that is closest to doped semiconductor layer 122) is doped. As a result, part of doped semiconductor layer 122 can be in contact with the doped part of semiconductor channel 128 (e.g., doped portion 128a), and filling layer 120 can be formed between memory stack 114 and another part of the doped semiconductor layer 122 in the vertical direction. As described below in detail, the formation of memory stack 114 and the formation of doped portion 128a of semiconductor channel 128 and doped semiconductor layer 122 occur at opposite sides of filling layer 120, thereby avoiding any deposition or etching process through openings extending through memory stack 114, thereby reducing the fabrication complexity and cost and increasing the yield and vertical scalability.

Similar to doped portion 128a of semiconductor channel 128, in some implementations, doped semiconductor layer 122 also includes N-type doped polysilicon. The dopant can be any suitable N-type dopants, such as P, Ar, or Sb, which contribute free electrons and increase the conductivity of the intrinsic semiconductor. Similar to doped portion 128a of semiconductor channel 128, in some implementations, the doping concentration of doped semiconductor layer 122 is between about $10^{19}$ cm$^{-3}$ and about $10^{21}$ cm$^{-3}$, such as between $10^{19}$ cm$^{-3}$ and $10^{21}$ cm$^{-3}$ (e.g., $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ cm$^{-3}$, $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ cm$^{-3}$, $10^{21}$ cm$^{-3}$, any range bounded by the lower end by any of these values, or in any range defined by any two of these values). The doping concentrations of doped semiconductor layer 122 disclosed herein can significantly reduce the contact resistance between semiconductor channel 128 and doped semiconductor layer 122 as well as the sheet resistance of doped semiconductor layer 122, compared with intrinsic semiconductors. As described below in detail, in some implementations, doped portion 128a of semiconductor channel 128 and doped semiconductor layer 122 have the same material (e.g., N-type doped polysilicon) with the same dopant as well as a continuous doping profile due to the same local activation process performed thereon. Thus, it is understood that the interface and boundary between doped portion 128a of semiconductor channel 128 and doped semiconductor layer 122 may become indistinguishable and thus cannot be discerned in 3D memory device 100.

As shown in FIG. 1, first semiconductor structure 102 of 3D memory device 100 can further include insulating structures 130 each extending vertically through interleaved stack conductive layers 116 and stack dielectric layers 118 of memory stack 114. Different from channel structure 124 that extends further into filling layer 120, insulating structures 130 stops at the bottom surface of filling layer 120, i.e., does not extend vertically into filling layer 120, according to some implementations. That is, the top surface of insulating structure 130 can be flush with or lower than the bottom surface of filling layer 120. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. Different from the slit structures in existing 3D NAND memory devices, which include front side ACS contacts, insulating structure 130 does not include any contact therein (i.e., not functioning as the source contact) and thus, does not introduce parasitic capacitance and leakage current with stack conductive layers 116, according to some implementations. In some implementations, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide. It is understood that in some examples, insulating structure 130 may be partially filled with non-dielectric materials, such as polysilicon, to adjust the mechanical properties, e.g., the hardness and/or stress, of insulating structure 130.

Moreover, as described below in detail, because the opening for forming insulating structure 130 is not used for forming doped semiconductor layer 122 and doped portion 128a of semiconductor channel 128, the increased aspect ratio of the opening (e.g., greater than 50) as the number of interleaved stack conductive layers 116 and stack dielectric layers 118 increases would not affect the formation of doped semiconductor layer 122 and doped portion 128a of semiconductor channel 128.

Instead of the front side source contacts, 3D memory device 100 can include one or more backside source contacts 132 above and in contact with doped semiconductor layer 122, as shown in FIG. 1. Source contacts 132 and memory stack 114 (and insulating structure 130 therethrough) can be disposed at opposite sides of filling layer 120 and thus, viewed as a "backside" source contact. In some implementations, source contact 132 is electrically connected to semiconductor channel 128 of channel structure 124 through doped semiconductor layer 122. Source contacts 132 can include any suitable types of contacts. In some implementations, source contacts 132 include a VIA contact. In some implementations, source contacts 132 include a wall-shaped contact extending laterally. Source contacts 132 can include one or more conductive layers, such as a metal layer (e.g., W, Co, Cu, or Al) or a silicide layer surrounded by an adhesive layer (e.g., titanium nitride (TiN)).

As shown in FIG. 1, 3D memory device 100 can further include a BEOL interconnect layer 135 above and electrically connected to source contacts 132 for pad-out, e.g., transferring electrical signals between 3D memory device 100 and external circuits. In some implementations, interconnect layer 135 includes one or more interlayer dielectric (ILD) layers 162 on doped semiconductor layer 122 and a redistribution layer 136 on ILD layers 162. The upper end of source contacts 132 is flush with the top surface of ILD layers 162, and the bottom surface of redistribution layer 136, and source contacts 132 extend vertically through ILD layers 162 to be in contact with doped semiconductor layer 122, according to some implementations. ILD layers 162 in interconnect layer 135 can include dielectric materials including, but not limited to, silicon oxide, silicon nitride, silicon oxynitride, low-k dielectrics, or any combination thereof. Redistribution layer 136 in interconnect layer 135 can include conductive materials including, but not limited to W, Co, Cu, Al, silicides, or any combination thereof. In some implementations, interconnect layer 135 further includes a passivation layer 138 as the outmost layer for passivation and protection of 3D memory device 100. Part of redistribution layer 136 can be exposed from passivation layer 138 as contact pads 140. That is, interconnect layer 135 of 3D memory device 100 can also include contact pads 140 for wire bonding and/or bonding with an interposer. As described below with respect to the fabrication process, in some implementations, source contacts 132 and redistribution layer 136 may be formed by the same process and have the same material, e.g., Al. Thus, source contacts 132 may be viewed as part of BEOL interconnect layer 135 as well in some examples.

In some implementations, first semiconductor structure 102 of 3D memory device 100 further includes contacts 142 and 144 through doped semiconductor layer 122 and filling layer 120. As doped semiconductor layer 122 can include polysilicon, contacts 142 and 144 are TSV contacts, according to some implementations. In some implementations, contact 142 extends through filling layer 120, doped semiconductor layer 122, and ILD layers 162 to be in contact with redistribution layer 136, such that doped semiconductor layer 122 is electrically connected to contact 142 through source contact 132 and redistribution layer 136 of interconnect layer 135. In some implementations, contact 144 extends through doped semiconductor layer 122, filling layer 120, and ILD layers 162 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some implementations, at least contact 144 further includes a spacer (e.g., a dielectric layer) to electrically separate contact 144 from doped semiconductor layer 122 and filling layer 120.

In some implementations, 3D memory device 100 further includes peripheral contacts 146 and 148 each extending vertically outside of memory stack 114. Each peripheral contact 146 or 148 can have a depth greater than the depth of memory stack 114 to extend vertically from interface contact 111 to filling layer 120 in a peripheral region that is outside of memory stack 114. In some implementations, peripheral contact 146 is below and in contact with contact 142, such that doped semiconductor layer 122 is electrically connected to peripheral circuit 108 in second semiconductor structure 106 through at least source contact 132, redistribution layer 136, contact 142, peripheral contact 146, interface contact 111, and interconnect 107. In some implementations, peripheral contact 148 is below and in contact with contact 144, such that peripheral circuit 108 in second semiconductor structure 106 is electrically connected to contact pad 140 for pad-out through at least contact 144, peripheral contact 148, interface contact 111, and interconnect 107. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1, 3D memory device 100 also includes a variety of local contacts (also known as "C1") as part of the interconnect structure, which are in contact with a structure in memory stack 114 directly. In some implementations, the local contacts include channel local contacts 150 each below and in contact with the lower end of respective channel structure 124, i.e., channel plug 129. Each channel local contact 150 can be electrically connected to a bit line contact (not shown) for bit line fan-out. In some implementations, the local contacts further include word line local contacts 152 each below and in contact with respective stack conductive layer 116 (including a word line) at the staircase structure of memory stack 114 for word line fan-out. Local contacts, such as channel local contacts 150 and word line local contacts 152, can be electrically connected to peripheral circuits 108 of second semiconductor structure 106 through at least interface contacts 111 and interconnects 107 of interface layer 104. In some implementations, each channel structure 124 corresponds to one channel local contact 150, one interconnect 107, and one peripheral circuit 108. In some other implementations, each peripheral contact 146/148 corresponds to one word line local contact 152, one interconnect 107, and one peripheral circuit 108. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Although an exemplary 3D memory device 100 is shown in FIG. 1, it is understood that by varying the relative positions of first and second semiconductor structures 102 and 106, the usage of backside source contacts 132 or known front side source contacts (not shown), and/or the pad-out locations (e.g., through first semiconductor structure 102 and/or second semiconductor structure 106), any other suitable architectures of 3D memory devices may be applicable in the present disclosure without further detailed elaboration.

FIG. 4 illustrates a block diagram of an exemplary system 400 having a 3D memory device, according to some aspects of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 4, system 400 can include a host 408 and a memory system 402 having one or more 3D memory devices 404 and a memory controller 406. Host 408 can be a processor of an electronic device, such as a central processing unit (CPU), or a system-on-chip (SoC), such as an application processor (AP). Host 408 can be configured to send or receive data stored in memory device 404.

3D memory device 404 can be any 3D memory devices disclosed herein, such as 3D memory device 100 shown in FIG. 1. In some implementations, each 3D memory device 404 includes a NAND Flash memory. Consistent with the scope of the present disclosure, 3D memory device 404 can be fabricated by forming a second semiconductor structure having peripheral circuits over an interface layer, which in turn is formed over a first semiconductor structure having a memory stack. The interface layer includes single crystalline silicon and a plurality of interconnects between the memory stack and the peripheral circuits. Therefore, the high thermal impact from the first semiconductor structure towards the second semiconductor is reduced. As a result, the electric performance of 3D memory device 404 can be improved, which in turn improves the performance of memory system 402 and system 400, e.g., achieving higher operation speed.

Memory controller 406 is coupled to 3D memory device 404 and host 408 and is configured to control 3D memory device 404, according to some implementations. Memory controller 406 can manage the data stored in 3D memory device 404 and communicate with host 408. In some implementations, memory controller 406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 406 can be configured to control operations of 3D memory device 404, such as read, erase, and program operations. Memory controller 406 can also be configured to manage various functions with respect to the data stored or to be stored in 3D memory device 404 including, but not limited to bad-block management, garbage collection, logical-to-physical address conversion, wear leveling, etc. In some implementations, memory controller 406 is further configured to process error correction codes (ECCs) with respect to the data read from or written to 3D memory device 404. Any other suitable functions may be performed by memory controller 406 as well, for example, formatting 3D memory device 404. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 406 and one or more 3D memory devices 404 can be integrated into various types of storage devices, for example, be included in the same package, such as a universal Flash storage (UFS) package or an eMMC package. That is, memory system 402 can be implemented as and packaged into different types of end electronic products. In one example as shown in FIG. 5A, memory controller 406 and a single 3D memory device 404 may be integrated into a memory card 502. Memory card 502 can include a PC card (PCMCIA, personal computer memory card international association), a CF card, a smart media (SM) card, a memory stick, a multimedia card (MMC, MMCmicro), an SD card (SD, mini SD, microSD, SDHC), a UFS, etc. Memory card 502 can further include a memory card connector 504 electrically coupling memory card 502 with a host (e.g., host 408 in FIG. 4). In another example as shown in FIG. 5B, memory controller 406 and multiple 3D memory devices 404 may be integrated into an SSD 506. SSD 506 can further include an SSD connector 508 electrically coupling SSD 506 with a host (e.g., host 408 in FIG. 4). In some implementations, the storage capacity and/or the operation speed of SSD 506 is greater than those of memory card 502.

Figure 2A:
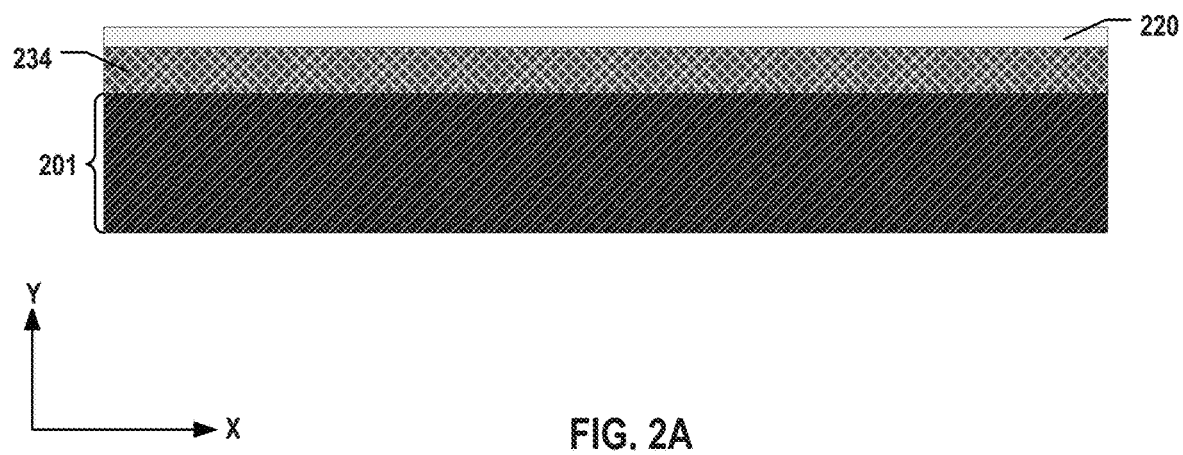
FIGS. 2A-2J illustrate a fabrication process for forming an exemplary 3D memory device, according to some aspects of the present disclosure.

FIGS. 2A-2J illustrate a fabrication process for forming an exemplary 3D memory device, according to some implementations of the present disclosure. FIG. 3 illustrates a flowchart of a method 300 for forming an exemplary 3D memory device, according to some implementations of the present disclosure. Examples of the 3D memory device depicted in FIGS. 2A-2J and 3 include 3D memory device 100 depicted in FIG. 1. FIGS. 2A-2J and 3 will be described together. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a semiconductor substrate 200 is provided. Semiconductor substrate 200 includes a carrier substrate 201, a stop layer 234 formed above carrier substrate 201, and a filling layer 220 formed over stop layer 234. Carrier substrate 201 may be removed from the final product. Carrier substrate 201 may be a part of a dummy wafer and may be made of any suitable materials, such as glass, sapphire, plastic, silicon, to name a few, to reduce the cost thereof. Filling layer 220 can include polysilicon, a high-k dielectric, or a metal. As described below in detail, stop layer 234 can act as an etch stop layer when etching the memory films of channel structures from the frontside or when removing carrier substrate 201 from the backside. Stop layer 234 may include any dielectric materials including, but not limited to, silicon oxide, silicon nitride, silicon oxynitride, low-k dielectrics, or any combination thereof. It is understood that in some examples, pad oxide layers (e.g., silicon oxide layers) may be formed between carrier substrate 201 and stop layer 234 to relax the stress between different layers and avoid peeling. As shown in FIG. 2A, stop layer 234 can be formed on carrier substrate 201 using one or more thin film deposition processes including, but not limited to, chemical vapor deposition (CVD), physical vapor deposition (PVD), atomic layer deposition (ALD), or any combination thereof. In some implementations, filling layer 220 is formed by depositing polysilicon, or any other suitable materials, such as a high-k dielectric or a metal, on stop layer 234 using one or more thin film deposition processes including, but not limited to, CVD, PVD, ALD, or any combination thereof.

Figure 2B:
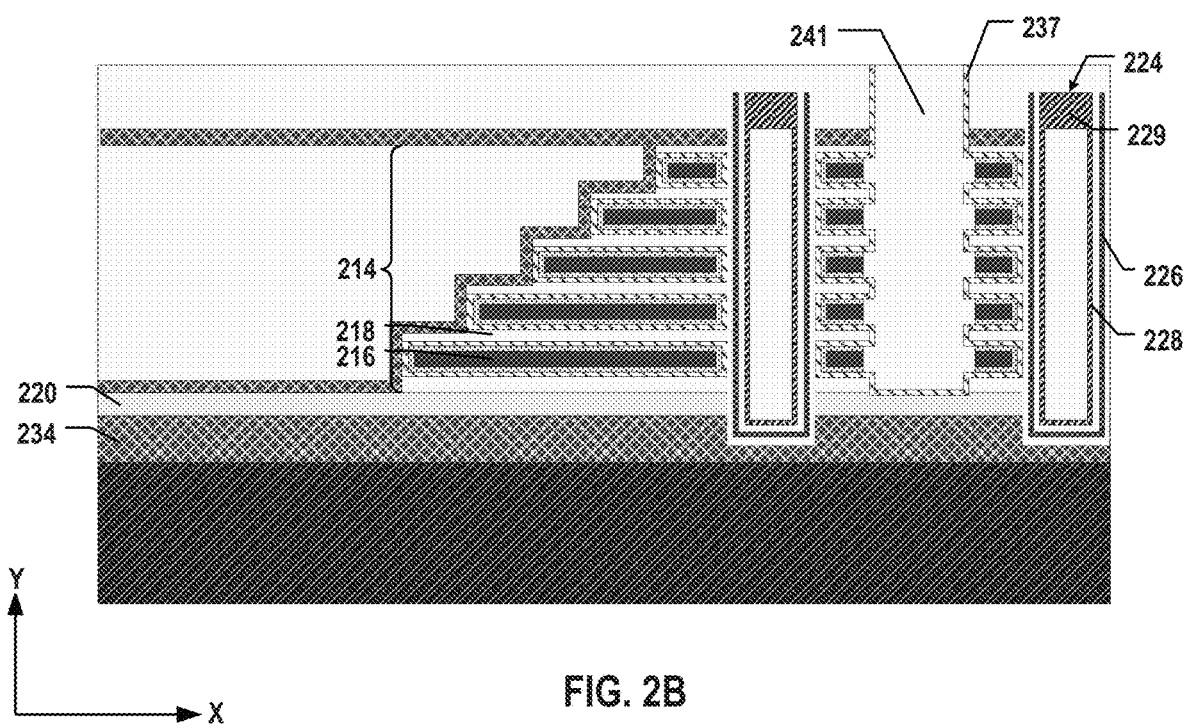
Figure 3:
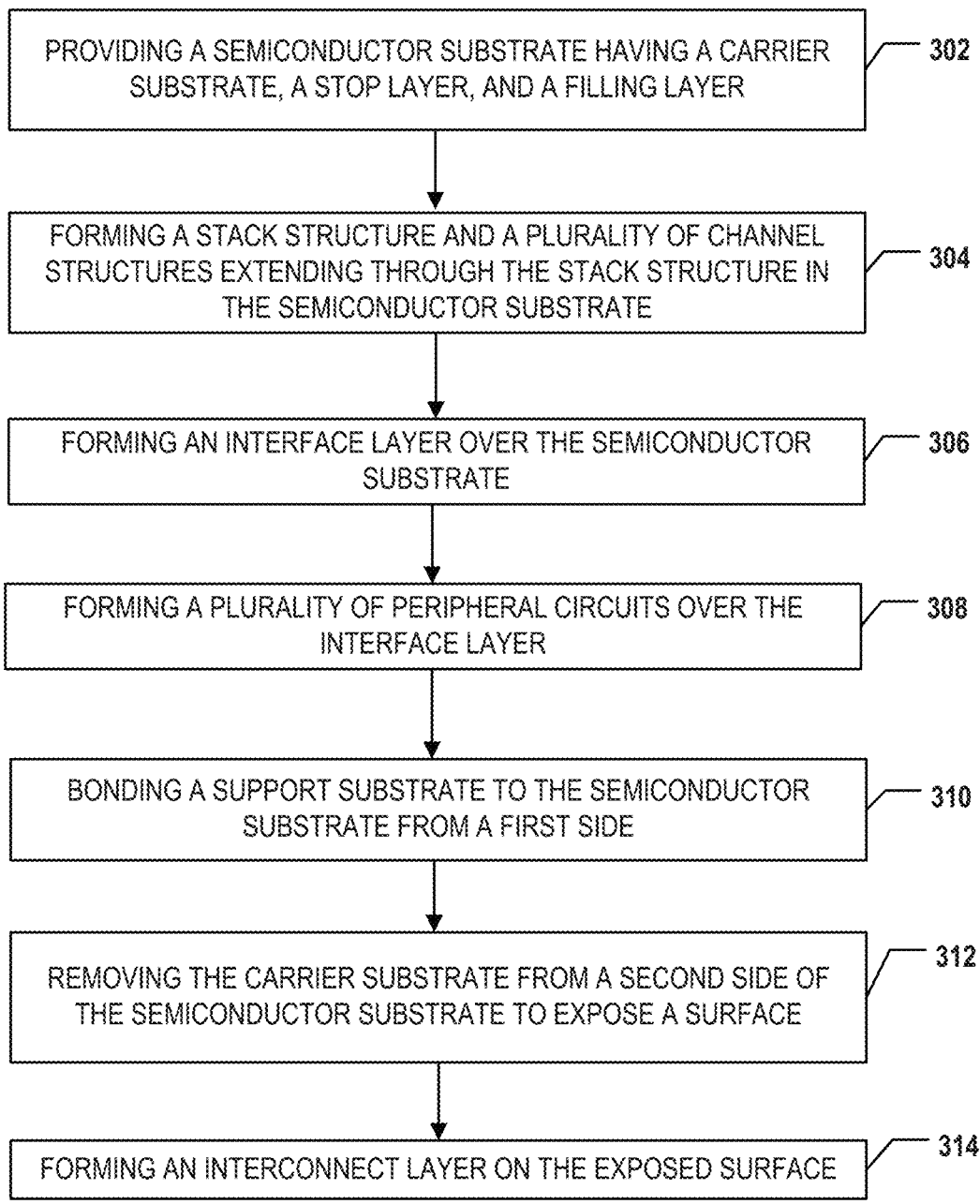
FIG. 3 illustrates a flowchart of a method for forming an exemplary 3D memory device, according to some aspects of the present disclosure.

Method 300 proceeds to operation 304, in which a memory stack 214 and a plurality of channel structures 224 extending through memory stack 214 may be formed in semiconductor substrate 200, as illustrated in FIG. 2B.

At the start of this operation, a dielectric stack (not shown) including a plurality pairs of a first dielectric layer (referred to herein as "stack sacrificial layer") and a second dielectric layer 218 (referred to herein as "stack dielectric layer 218", together referred to herein as "dielectric layer pairs") may be formed on filling layer 220. The dielectric stack may include interleaved stack sacrificial layers (not shown) and stack dielectric layers 218, according to some implementations. In some implementations, the stack sacrificial layers are subsequently replaced by stack conductive layers 216, which will be discussed in detail below. Stack dielectric layers 218 and the stack sacrificial layers can be alternatingly deposited on filling layer 220 above carrier substrate 201 and stop layer 234 to form the dielectric stack. In some implementations, each stack dielectric layer 218 includes a layer of silicon oxide, and each stack sacrificial layer includes a layer of silicon nitride. The dielectric stack can be formed by one or more thin film deposition processes including, but not limited to, CVD, PVD, ALD, or any combination thereof. Thus, a staircase structure can be formed on the edge of the dielectric stack. The staircase structure can be formed by performing a plurality of so-called "trim-etch" cycles to the dielectric layer pairs of the dielectric stack toward carrier substrate 201. Due to the repeated trim-etch cycles applied to the dielectric layer pairs of the dielectric stack, the dielectric stack can have one or more tilted edges and a top dielectric layer pair shorter than the bottom one.

In some implementations, a plurality of channel structures 224 extending vertically through the dielectric stack and filling layer 220 can be formed. Each channel structure 224 can include a memory film 226 and a semiconductor channel 228. In some implementations, to form channel structure 224, a channel hole extending vertically through the dielectric stack, filling layer 220, and stop layer 234 is formed, and memory film 226 and semiconductor channel 228 are sequentially formed along a sidewall and a bottom surface of the channel hole. Each channel hole is an opening extending vertically through the dielectric stack, filling layer 220, and stop layer 234, stopping at stop layer 234. In some implementations, a plurality of openings are formed, such that each opening becomes the location for growing an individual channel structure 224 in the later process. In some implementations, fabrication processes for forming the channel holes of channel structures 224 include wet etching and/or dry etching, such as deep RIE (DRIE). The etching of the channel holes continues until being stopped by stop layer 234. In some implementations, the etching conditions, such as etching rate and time, can be controlled to ensure that each channel hole has reached and stopped by stop layer 234 to minimize the gouging variations among the channel holes and channel structures 224 formed therein. It is understood that depending on the specific etching selectivity, one or more channel holes may extend into stop layer 234 to a small extent, which is still viewed as being stopped by stop layer 234 in the present disclosure.

In some implementations, a memory film 226 including a blocking layer, a storage layer, and a tunneling layer, and a semiconductor channel 228 are sequentially formed in this order along sidewalls and the bottom surface of the channel hole. In some implementations, the blocking layer, the storage layer, and the tunneling layer are first deposited along the sidewalls and bottom surface of the channel hole in this order using one or more thin film deposition processes, such as ALD, CVD, PVD, any other suitable processes, or any combination thereof, to form memory film 226. Semiconductor channel 228 then can be formed by depositing a semiconductor material, such as polysilicon (e.g., undoped polysilicon), over the tunneling layer using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are sequentially deposited to form the blocking layer, the storage layer, and the tunneling layer of memory film 226 and semiconductor channel 228.

In some implementations, a capping layer is formed in the channel hole and over semiconductor channel 228 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug 229 can then be formed in the top portion of the channel hole. In some implementations, parts of memory film 226, semiconductor channel 228, and the capping layer that are on the top surface of the dielectric stack are removed and planarized by chemical mechanical polishing (CMP), wet etching, and/or dry etching. A recess then can be formed in the top portion of the channel hole by wet etching and/or drying etching parts of semiconductor channel 228 and the capping layer in the top portion of the channel hole. Channel plug 229 can then be formed by depositing semiconductor materials, such as polysilicon, into the recess by one or more thin film deposition processes, such as CVD, PVD, ALD, or any combination thereof. Channel structure 224 is thereby formed through the dielectric stack, filling layer 220, and stop layer 234, stopping at stop layer 234, according to some implementations.

In some implementations, a slit 241 is formed that extends vertically through the dielectric stack and stops at filling layer 220. In some implementations, fabrication processes for forming slit 241 include wet etching and/or dry etching, such as DRIE. A gate replacement then can be performed through slit 241 to replace the dielectric stack with a memory stack 214 (shown in FIG. 2B). Specifically, lateral recesses (not shown) are first formed by removing stack sacrificial layers through slit 241. In some implementations, the stack sacrificial layers are removed by applying etchants through slit 241, creating lateral recesses interleaved between stack dielectric layers 218. The etchants can include any suitable etchants that etch the stack sacrificial layers selective to stack dielectric layers 218.

In some implementations, stack conductive layers 216 (including gate electrodes and adhesive layers) are deposited into the lateral recesses through slit 241. In some implementations, a gate dielectric layer 237 is deposited into the lateral recesses prior to stack conductive layers 216, such that stack conductive layers 216 are deposited on gate dielectric layer 237. Stack conductive layers 216, such as metal layers, can be deposited using one or more thin film deposition processes, such as ALD, CVD, PVD, any other suitable processes, or any combination thereof. In some implementations, gate dielectric layer 237, such as a high-k dielectric layer, is formed along the sidewall and at the bottom of slit 241 as well. Memory stack 214 including interleaved stack conductive layers 216 and stack dielectric layers 218 is thereby formed, replacing the dielectric stack, according to some implementations.

Method 300 proceeds to operation 306, in which an interface layer 204 having single crystalline silicon is formed over semiconductor substrate 200, as illustrated in FIGS. 2C to 2F.

In some implementations, an insulating structure 230 extending vertically through memory stack 214 is formed, stopping on the top surface of filling layer 220. Insulating structure 230 can be formed by depositing one or more dielectric materials, such as silicon oxide, into slit 241 to fully or partially fill slit 241 (with or without an air gap) using one or more thin film deposition processes, such as ALD, CVD, PVD, any other suitable processes, or any combination thereof. In some implementations, insulating structure 230 includes gate dielectric layer 237 (e.g., including high-k dielectrics) and a dielectric capping layer (not shown) (e.g., including silicon oxide). Although not shown, in some examples, the dielectric capping layer may partially fill slit 241, and a polysilicon core layer (not shown) may fill the remaining space of slit 241 as part of insulating structure 230 to adjust the mechanical properties, such as hardness or stress, of insulating structure 230.

Figure 2C:
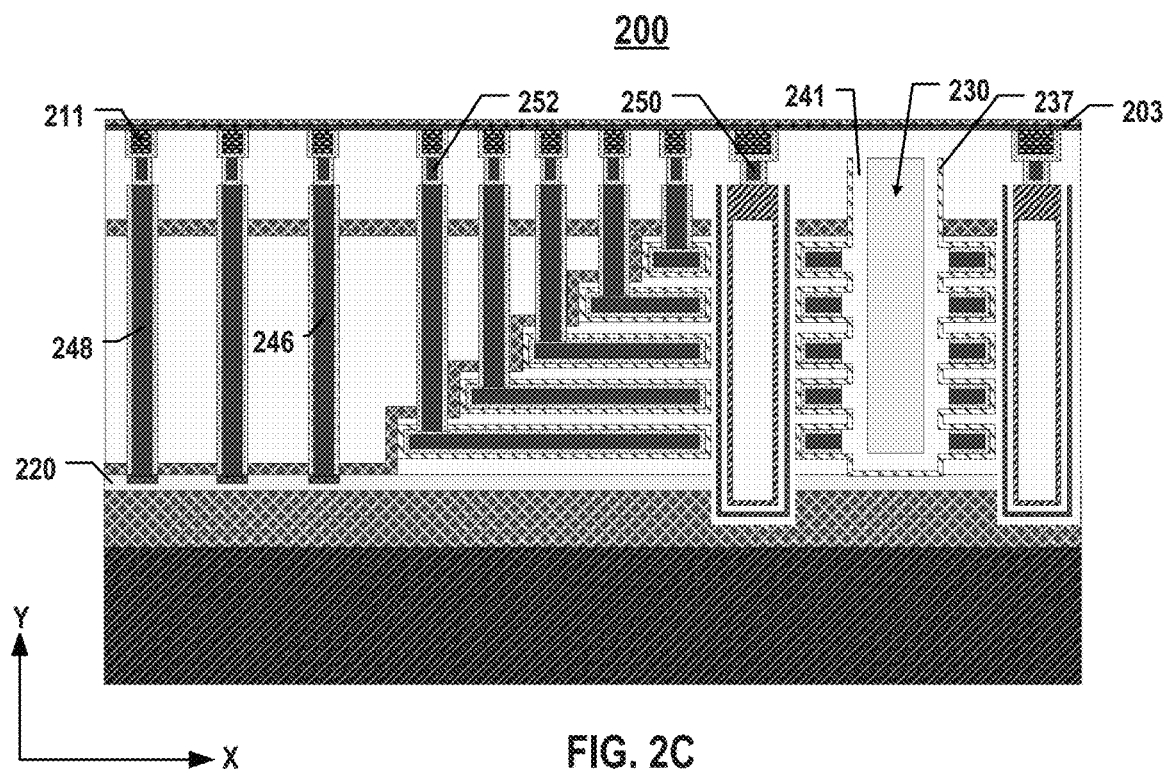

As illustrated in FIG. 2C, after the formation of insulating structure 230, peripheral contacts 246 and 248, local contacts (including channel local contacts 250 and word line local contacts 252), and interface contacts 211 (e.g., MEOL contacts and/or BEOL contacts) are formed from the lower portion to the upper portion of semiconductor substrate 200. A local dielectric layer can be formed on memory stack 214 by depositing dielectric materials, such as silicon oxide or silicon nitride, using one or more thin film deposition processes, such as CVD, PVD, ALD, or any combination thereof, on top of memory stack 214. Peripheral contacts 246 and 248, channel local contacts 250, word line local contacts 252, and interface contacts 211 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof. Contact materials may include, but not limited to W, Co, Cu, Al, silicides, or any combination thereof. In some implementations, the upper surfaces of interface contacts 211 are flush with the upper surface of the local dielectric layer, which is also the upper surface of semiconductor substrate 200 at this operation.

Subsequently, the upper surface of semiconductor substrate 200 is grinded to obtain a flat or substantially flat surface. In some implementations, one or more insulation layers 203 (individually and collectively referred to as insulation layer 203) may be formed on top of the upper surface of semiconductor substrate 200. To form insulation layer 203, dielectric materials (including, but not limited to, silicon oxide, silicon nitride, silicon oxynitride, low dielectric constant (low-k) dielectrics, or any combination thereof) are deposited over semiconductor substrate 200 using one or more thin film deposition processes, such as CVD, PVD, ALD, or any combination thereof.

Figure 2D:
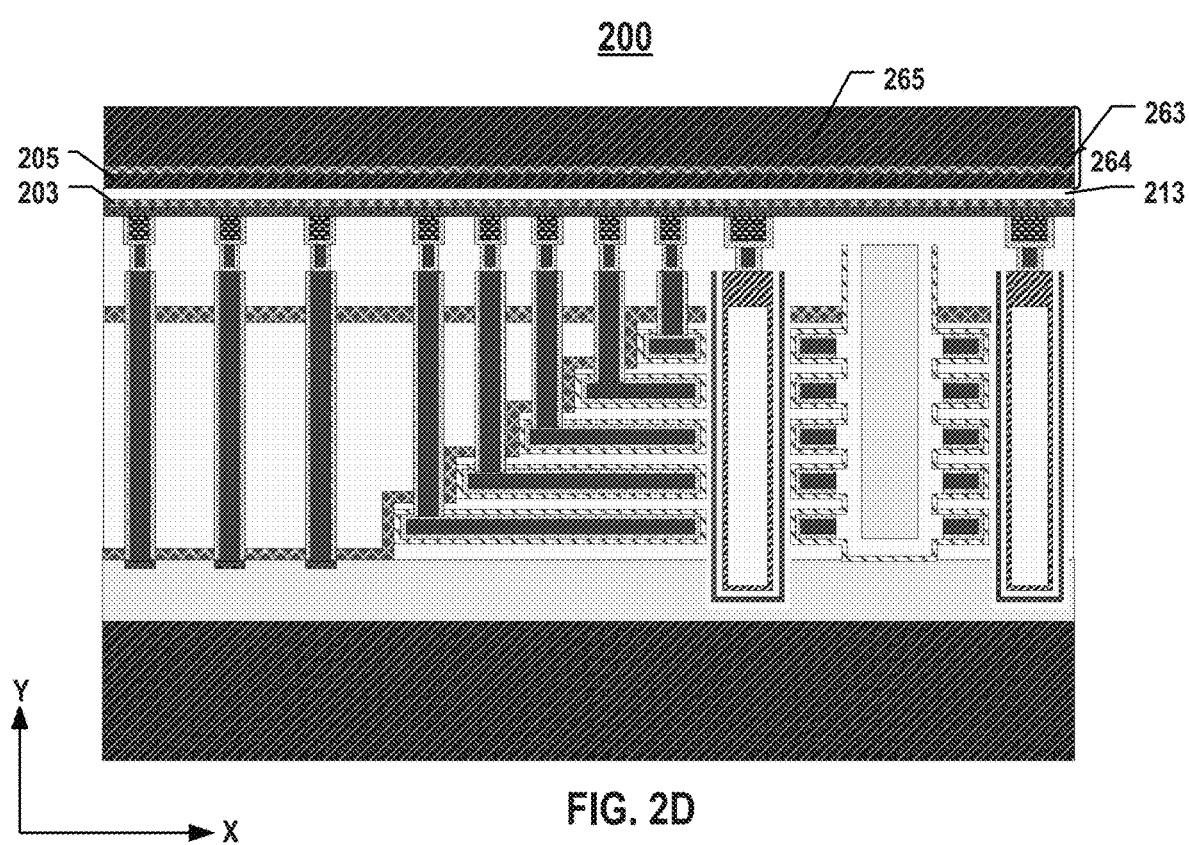

As illustrated in FIG. 2D, after the formation of insulation layer 203, a carbon-doped silicon nitride layer 213 may be formed on top of insulation layer 203. Carbon-doped silicon nitride layer 213 may be formed in various ways. In some implementations where the upper surface of insulation layer 203 includes silicon nitride, carbon may be doped into insulation layer 203 in order to form carbon-doped silicon nitride layer 213. In other implementations, carbon-doped silicon nitride layer 213 may be deposited in a chamber using CVD, plasma enhanced CVD, or any other suitable deposition method. Carbon-doped silicon nitride layer 213 may serve as a stop layer that prevents metal diffusion during a bonding process.

In some implementations, a composite layer 264 may be formed on the upper surface of carbon-doped silicon nitride layer 213. Composite layer 264 may comprise a single crystalline silicon layer 205 at the bottom, an insulation layer 263 in the middle, and a sacrifice layer 265 on the top. In some implementations, composite layer 264 may be manufactured independently from semiconductor substrate 200 as a silicon wafer (e.g., silicon-on-insulator (SOI)). For example, a wafer made of single crystalline silicon may first be provided by cutting from a large cylindrical ingot of silicon. Then high energy ion implantation may be carried out on the wafer so that an oxygen-rich layer may be formed within the wafer, which is subsequently oxidized to form an insulation layer (e.g., silicon oxide layer). Composite layer 264 including heterogeneous materials (e.g., single crystalline silicon, silicon oxide, etc.) is thus obtained. Subsequently, as shown in FIG. 2D, composite layer 264 may be bonded to semiconductor substrate 200 using a known wafer binding process.

Figure 2E:
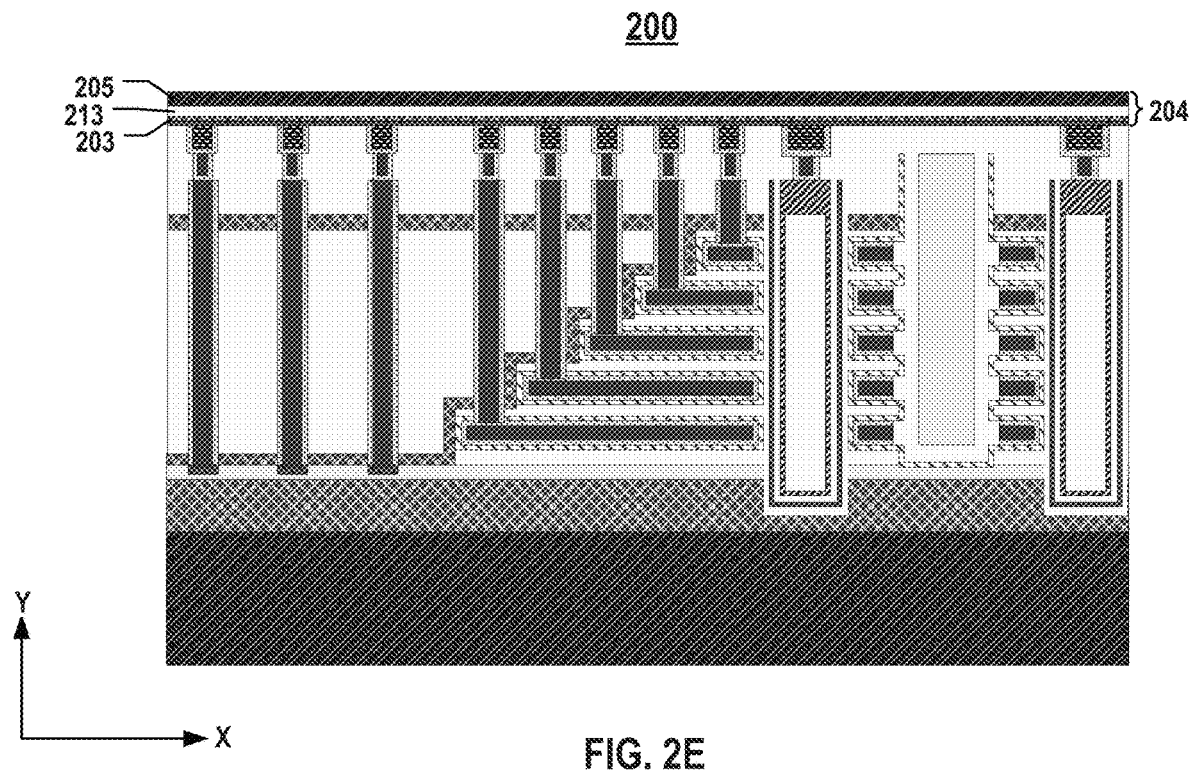

As illustrated in FIG. 2E, a portion of composite layer 264 that includes sacrifice layer 265 and insulation layer 263 may be subsequently broken and peeled off from the rest of semiconductor substrate 200 in a de-bonding process along a heterogeneous interface that separates the layers of heterogeneous materials, e.g., the interface between insulation layer 263 and single crystalline silicon layer 205. Thus, only single crystalline silicon layer 205 is left on top of carbon-doped silicon nitride layer 213. This bonding and de-bonding process using silicon wafer also makes it easy to control the thickness of single crystalline silicon layer 205 and thus the thickness of interface layer 204.

Up to this step, interface layer 204 is formed over semiconductor substrate 200. In some implementations, interface layer 204 has a thickness between 50 nm and 10 µm. In some specific applications, interface layer 204 may be formed to have a thickness of 1 µm to 10 µm, so that the final device may have better structural rigidity that would reduce bending or peeling in light of the increased internal stress caused by the multi-layer structure of the memory stack.

Figure 2F:
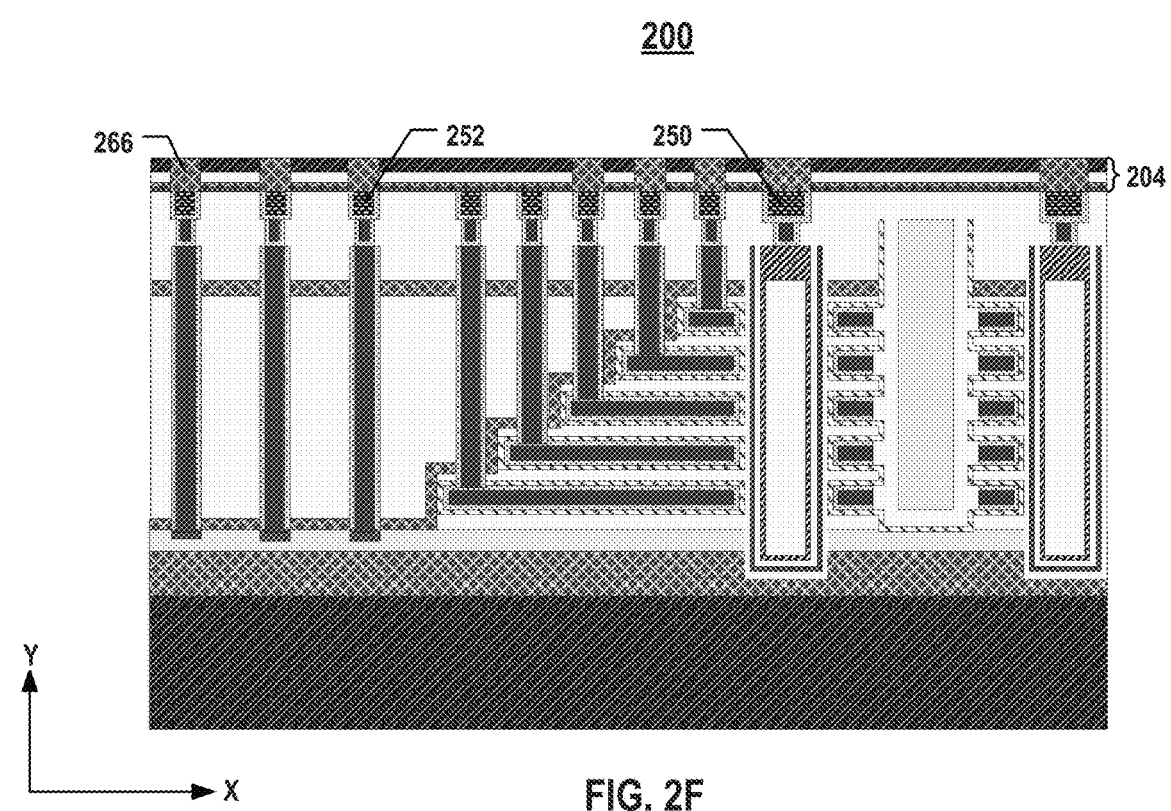

Referring to FIG. 2F, a plurality of insulation islands 266 may be formed within interface layer 204. The locations of such insulation islands 266 may be adjacent to where local contacts (including channel local contacts 250 and word line local contacts 252) are formed within semiconductor substrate 200. In some implementations, the width of each insulation island 266 may be equal to or slightly larger than that of its adjacent local contact, so that when an interconnect (shown in FIG. 2H below) is subsequently formed inside insulation island 266, the interconnect may be wrapped by the remaining insulation island 266 on its sidewalls while having a contact area substantially the same as the surface area of its adjacent local contact, thus improving electrical connectivity. In some implementations, the upper surfaces of insulation islands 266 are flush with the upper surface of interface layer 204. Such enhanced flatness of semiconductor substrate 200 allows easy formation of another semiconductor structure thereon. As one example of the manufacturing insulation islands 266, multiple openings may be etched at the abovementioned locations through interface layer 204 using wet etching and/or dry etching (e.g., RIE), followed by filling the openings with dielectric materials (including, but not limited to, silicon oxide, silicon nitride, silicon oxynitride, low dielectric constant (low-k) dielectrics, or any combination thereof) using one or more thin film deposition processes, such as ALD, CVD, PVD, any other suitable processes, or any combination thereof.

Figure 2G:
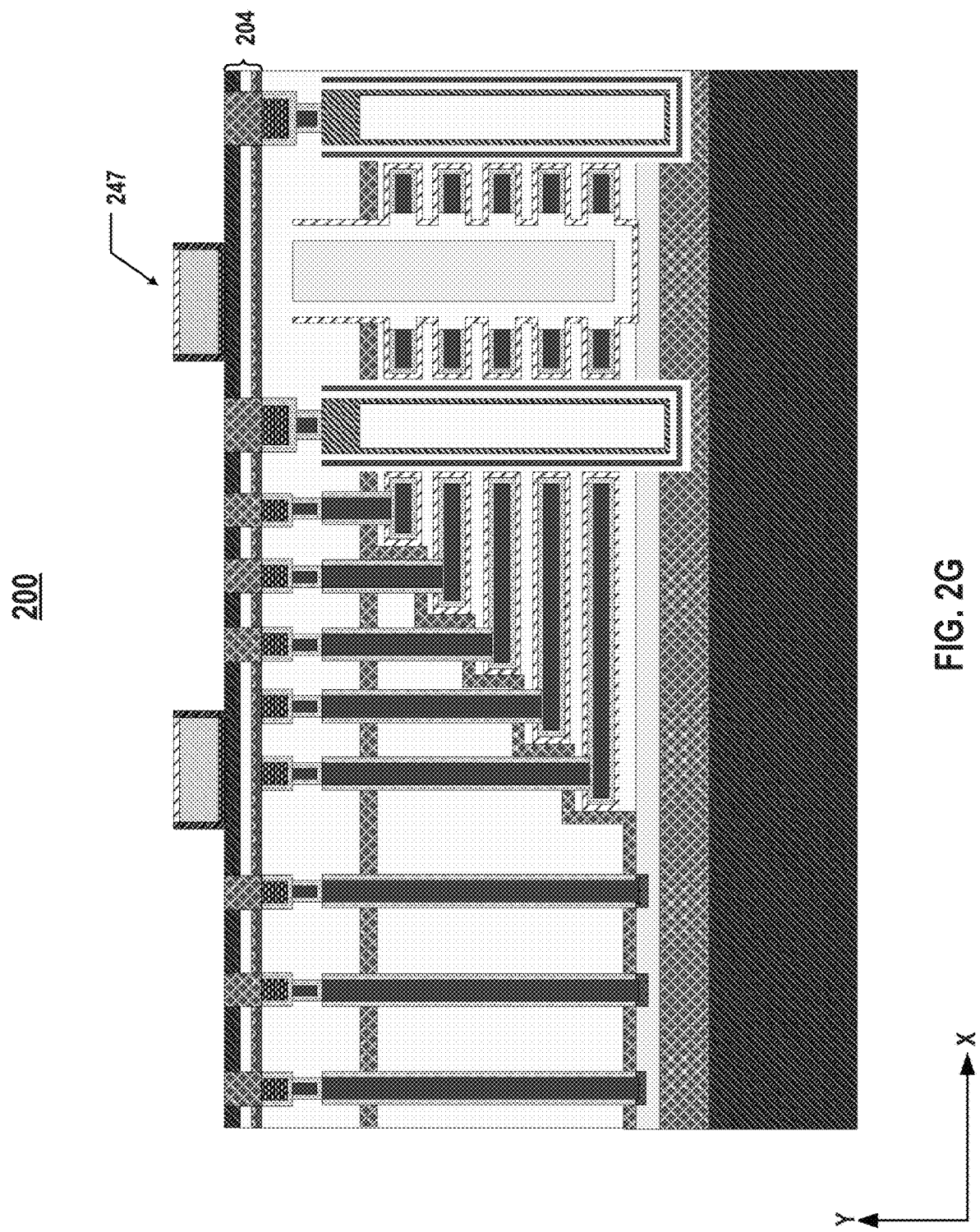
Figure 2H:
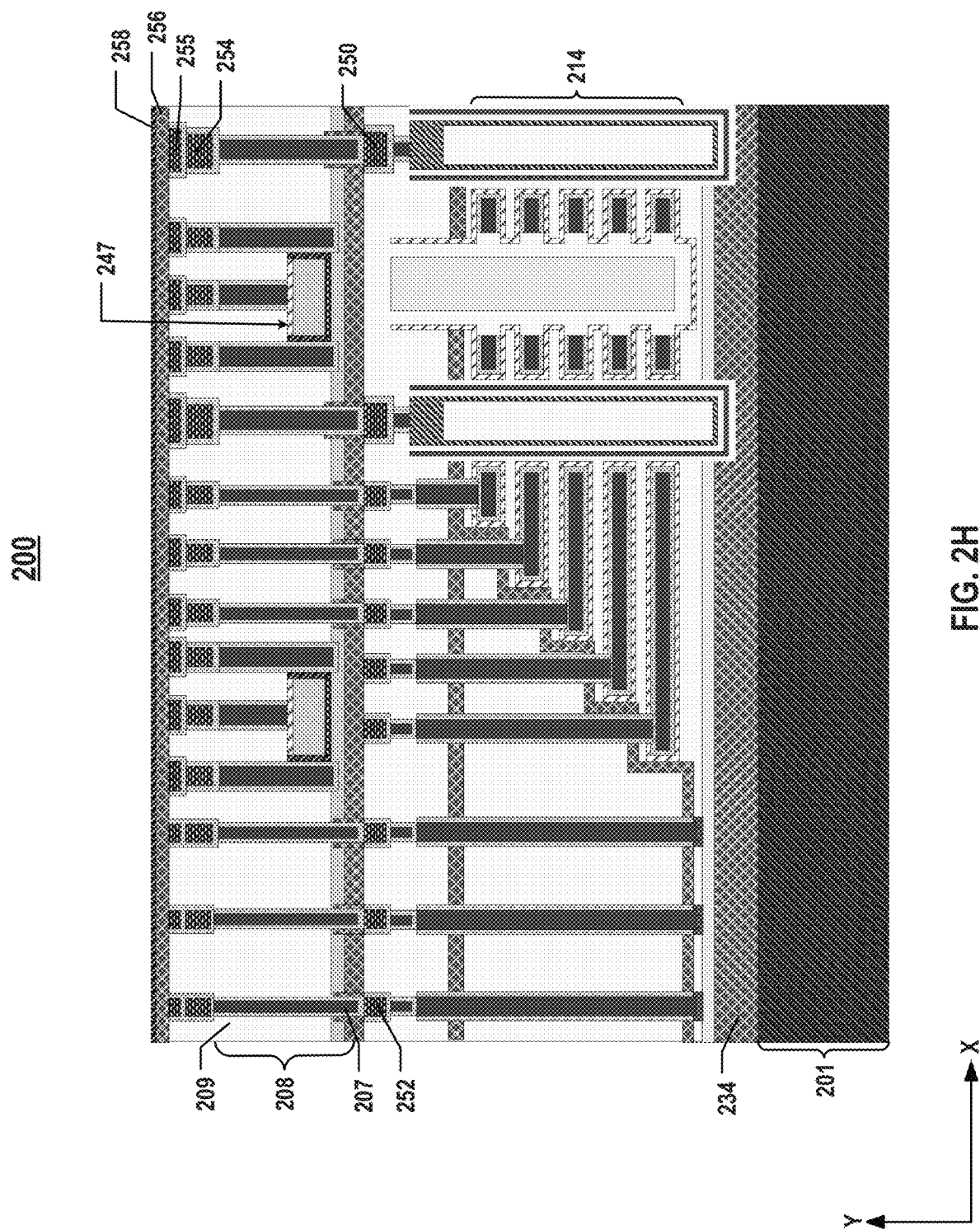

Method 300 proceeds to operation 308, in which a plurality of peripheral circuits 208 are formed over interface layer 204, as illustrated in FIGS. 2G to 2H. Peripheral circuits 208 are electrically connected to memory stack 214 through interconnects 207.

As illustrated in FIG. 2G, in some implementations, gate structures 247 are formed over interface layer 204. Each gate structure 247 may include a gate electrode surrounded by a spacer layer (e.g., a silicon nitride layer) on the sidewalls or a gate dielectric layer (such as a silicon oxide layer or a high-k dielectric layer) on the top surface. The gate electrodes can include conductive materials including, but not limited to, W, Co, Cu, Al, polysilicon, doped silicon, silicides, or any combination thereof. To form the gate electrodes, a conductive layer, such as a polysilicon layer, may be deposited on interface layer 204 using one or more thin film deposition processes, such as CVD, PVD, ALD, or any combination thereof. Then certain portions of the conductive layer are removed by wet etching and/or dry etching, such as DRIE, in accordance with a predetermined pattern to leave gate electrodes on top of interface layer 204, as illustrated in FIG. 2G.

As illustrated in FIG. 2H, a plurality of transistors may be formed, each of which includes gate structure 247 and a pair of drain and source (not shown) formed in interface layer 204 as doped regions. In some implementations, doped regions (not shown) are formed in interface layer 204 by ion implantation and/or thermal diffusion, which function, for example, as source regions and/or drain regions of the transistors. In some implementations, isolation regions (e.g., STIs) are also formed in interface layer 204 by wet etching and/or dry etching and thin film deposition. The transistors can form peripheral circuits 208 on interface layer 204.

In some implementations, the portion of peripheral circuits 208 that penetrate into interface layer 204 are interconnects 207, as shown in FIG. 2H, through which peripheral circuits 208 are electrically connected to memory stack 214. This configuration can be achieved by, for example, designing a photomask for etching silicon layer 209 to create a plurality of transistors therein in accordance with a pattern corresponding to the pattern of local contacts (including channel local contacts 250 and word line local contacts 252). As a result, peripheral circuits 208 and interconnects 207 may be formed at locations corresponding to the local contacts. In some implementations, silicon layer 209 is etched until reaching the bottom surface of interface layer 204, so that the portion of transistors making up interconnects 207 are in contact with the local contacts for transmitting electrical signals. In some implementations, peripheral circuits 208 may include vertical interconnect access (VIA) contacts. Such interconnects can broadly include any suitable types of interconnects, such as middle-end-of-line (MEOL) interconnects and back-end-of-line (BEOL) interconnects. In some other implementations, especially where interface layer 204 has a large thickness, peripheral circuits 208 may include TSV type of contacts.

As illustrated in FIG. 2H, following the formation of peripheral circuits 208, contacts 254 and 255 are further formed to facilitate the transmission of electrical signals between peripheral circuits 208 and circuitry outside of the 3D memory device. Similar to the formation of other contacts described hereinabove, contacts 254 and 255 may be formed by using a plurality of processes including, but not limited to, photolithography, etching, thin film deposition, CMP, and any other suitable processes. In some implementations, an insulation layer 256 and a passivation layer 258 may be deposited on top of contacts 254 and 255.

Figure 2I:
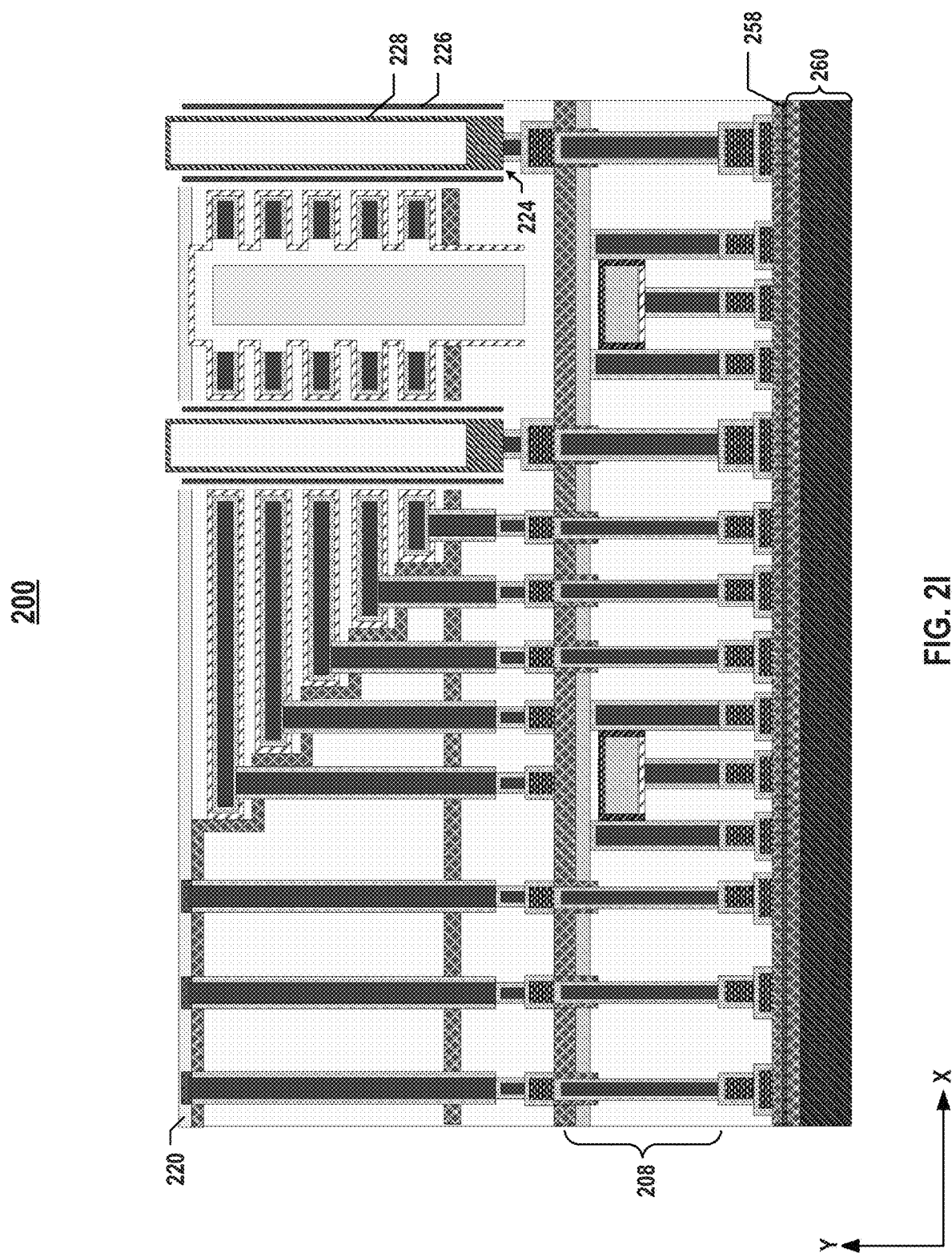
Figure 2J:
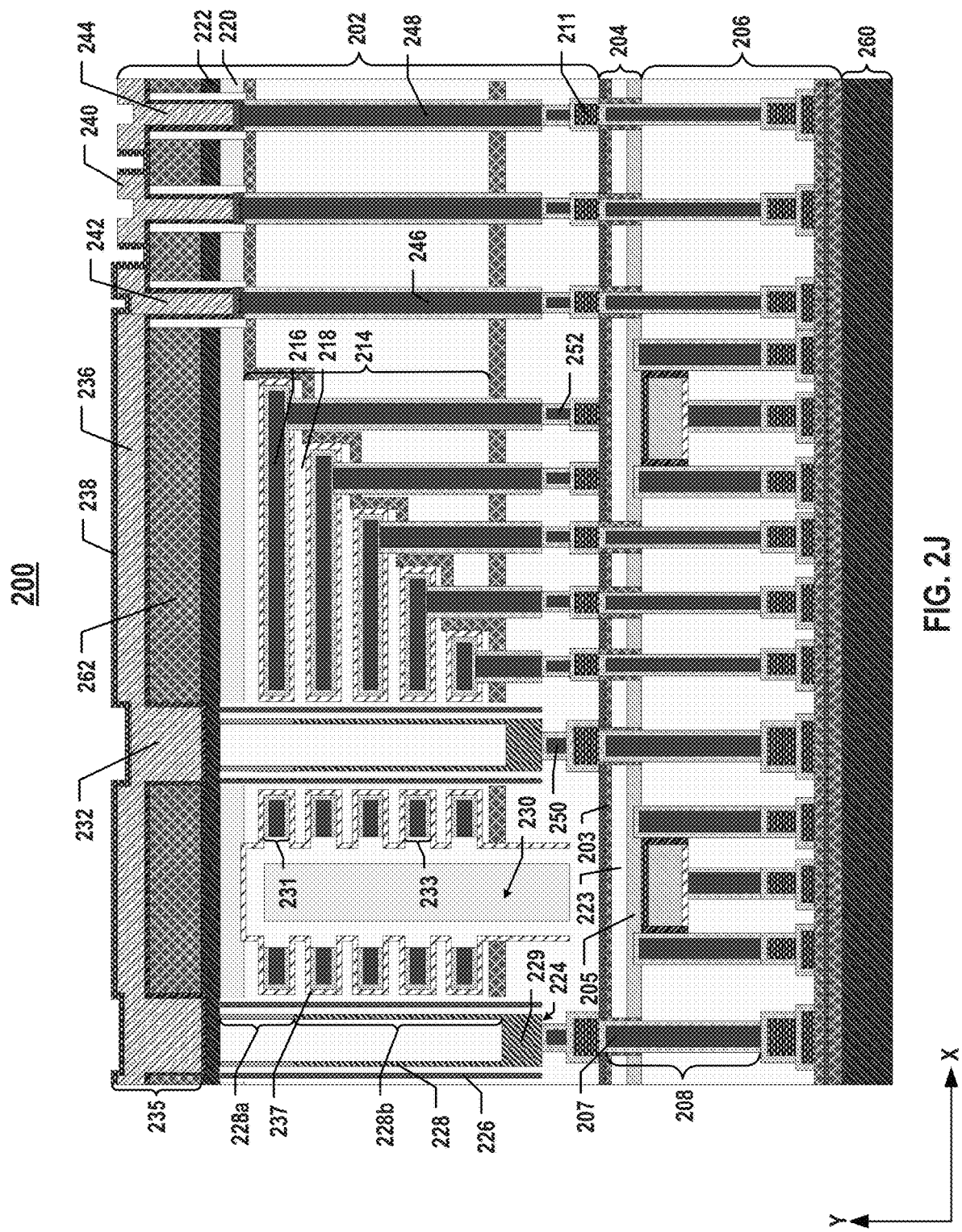

Method 300 proceeds to operations 310, 312 and 314, in which a support substrate 260 is bonded to semiconductor substrate 200 on a first surface, carrier substrate 201 and stop layer 234 (shown in FIG. 2H) are removed from semiconductor substrate 200 to expose a second surface opposite to the first surface, and an interconnect layer 235 is formed on the second surface, as illustrated in FIGS. 2I and 2J.

As illustrated in FIG. 2I, the view of semiconductor substrate 200 is flipped upside down from that in FIG. 2H. Starting from FIG. 2I, the spatial relationship among different components of semiconductor substrate 200 will be described inversely along the vertical direction (i.e., y-direction in FIGS. 2I and 2G). However, this does not alter the physical locations of these components inside semiconductor substrate 200. In the fabrication process, semiconductor substrate 200 may be flipped over by a machine (e.g., a CMP machine, a polish grinder etc.) so that carrier substrate 201 at the bottom thereof in the previous operations (such as operations 302, 304, 306, and 308) now faces upward.

According to the present disclosure, the thickness of the entire semiconductor substrate 200 is generally between 1 µm and 100 µm. Depending on the manufacturing process, the thickness may be too small to ensure sufficient structural rigidity and thus tend to cause bending, peeling off, break-up, or other defects of the semiconductor device in some occasions. Thus, in some implementations, a support substrate 260 may be added on a first side of semiconductor substrate 200 via a bonding process to increase structural rigidity. The bonding surface may be a surface on the side of semiconductor substrate 200 with passivation layer 258. The thickness of support substrate 260 may be at least 300 µm. In some implementations, support substrate 260 may include silicon and have a thickness of 750 µm. In some implementations, support substrate 260 may be bonded to semiconductor substrate 200 directly or with an interposer.

In some implementations, carrier substrate 201 can be removed from a second side of semiconductor substrate 200 until being stopped by stop layer 234. The second side may be opposite to the first side. Carrier substrate 201 can be removed by CMP, grinding, dry etching, and/or wet etching. In some implementations, carrier substrate 201 can be peeled off. In some implementations in which carrier substrate 201 includes silicon and stop layer 234 includes silicon nitride, carrier substrate 201 is removed by silicon CMP, which can be automatically stopped when reaching stop layer 234 having materials other than silicon, i.e., acting as a backside CMP stop layer. In some implementations, carrier substrate 201 (a silicon substrate) is removed by wet etching using tetramethylammonium hydroxide (TMAH), which is automatically stopped when reaching stop layer 234 having materials other than silicon, i.e., acting as a backside etch stop layer. Stop layer 234 can ensure the complete removal of carrier substrate 201 without the concern of thickness uniformity after thinning.

In some implementations, stop layer 234 is removed by using, for example, wet etching by phosphoric acid, CMP, or grinding, after removal of carrier substrate 201. As a result, the upper surface of filling layer 220 and parts of channel structures 224 are exposed. The exposed parts of channel structures 224 may include the top portions of memory film 226 (including the blocking layer, the storage layer, and the tunneling layer) and semiconductor channel 228 with respect to each channel structure 224. In some implementations, the exposed top portion of semiconductor channel 228 is doped to increase conductivity. For example, a tilted ion implantation process may be performed to dope the top portion of semiconductor channel 228 (e.g., including polysilicon) with any suitable dopants (e.g., N-type dopants such as P, As, or Sb) to a desired doping concentration, thus creating a doped portion 228a and leaving the rest of semiconductor channel 228 as undoped portion 228b, as illustrated in FIG. 2J.

In some implementations, a doped semiconductor layer 222 is formed on the surface of semiconductor substrate 200. For example, a semiconductor layer (e.g., polysilicon) is deposited over the surface of semiconductor substrate 200 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 222, in-situ doping of N-type dopants, such as P, As, or Sb, is performed when depositing the semiconductor layer over the surface of semiconductor substrate 200. In some implementations, a CMP process can be performed to remove any excess doped semiconductor layer 222 as needed.

Subsequently, one or more ILD layers 262 are formed on doped semiconductor layer 222. ILD layers 262 can be formed by depositing dielectric materials on the top surface of doped semiconductor layer 222 using one or more thin film deposition processes, such as ALD, CVD, PVD, any other suitable processes, or any combination thereof. Multiple contact openings (not shown) can be formed to expose various components in semiconductor substrate 200, such as peripheral contacts 246 and 248, and portions of doped semiconductor layer 222 with channel structures 224 lying underneath, as illustrated in FIG. 2J. In some implementations, the contact openings are formed using wet etching and/or dry etching, such as RIE.

As illustrated in FIG. 2J, a conductive layer is formed in the contact openings, thus forming source contacts 232, contact pads 240, and contacts 242 and 244, as well as over the non-etched portions of ILD layers 262, thus forming a redistribution layer 236, which electrically connects multiple contacts, according to some implementations. Source contacts 232 are above and in contact with doped semiconductor layer 222, according to some implementations. In some implementations, the conductive layer, such as Al, is deposited into the contact openings using one or more thin film deposition processes, such as ALD, CVD, PVD, any other suitable processes, or any combination thereof, to fill the contact openings. A planarization process, such as CMP, can then be performed to remove excess conductive layer. Subsequently, a passivation layer 238 can be formed over contact 242, redistribution layer 236, and source contacts 232. ILD layers 262 and redistribution layer 236 can collectively be referred to as an interconnect layer 235.

According to one aspect of the present disclosure, a 3D memory device includes a first semiconductor structure, a second semiconductor structure opposite to the first semiconductor structure, and an interface layer between the first semiconductor structure and the second semiconductor structure. The first semiconductor structure includes a memory stack having a plurality of interleaved stack conductive layers and stack dielectric layers. The second semiconductor structure includes a plurality of peripheral circuits electrically connected to the memory stack. The interface layer includes single crystalline silicon and a plurality of interconnects between the memory stack and the peripheral circuits.

In some implementations, the interface layer further includes an insulation layer, a carbon-doped silicon nitride layer, and a single crystalline silicon layer, and the insulation layer, the carbon-doped silicon nitride layer, and the single crystalline silicon layer are disposed sequentially from the first semiconductor structure to the second semiconductor structure.

In some implementations, the first semiconductor structure further includes a channel structure extending through the memory stack. The channel structure includes a memory film, a semiconductor channel, and a channel plug. Each of the plurality of the interconnects is a portion of a peripheral circuit. The peripheral circuit is further electrically connected to the channel structure through the channel plug, a channel local contact and the interconnect of the peripheral circuit. Each of the plurality of the interconnects is a portion of one of the plurality of peripheral circuits.

In some implementations, the semiconductor channel further includes a doped portion that is further away from the interface layer than the channel plug.

In some implementations, the stack conductive layers include a source select gate laterally facing the doped portion.

In some implementations, the 3D memory device further includes a filling layer between the memory stack and a doped semiconductor layer.

In some implementations, the plurality of interconnects include one or more TSV type of contacts.

In some implementations, a thickness of the interface layer is between 1 μm and 10 μm.

In some implementations, a side of the second semiconductor structure facing away from the interface layer is attached to a support substrate.

In some implementations, the thickness of the support substrate is at least 300 μm.

According to another aspect of the present disclosure, a method for forming a 3D memory device is provided. A semiconductor substrate having a carrier substrate, a stop layer, and a filling layer is provided. A memory stack and a plurality of channel structures extending through the memory stack are formed in the semiconductor substrate. Each channel structure includes a memory film, a semiconductor channel, and a channel plug. An interface layer is formed over the semiconductor substrate. The interface layer includes single crystalline silicon. A plurality of peripheral circuits are formed over the interface layer. The peripheral circuits are electrically connected to the memory stack. A support substrate is bonded to the semiconductor substrate from a first side. The carrier substrate is removed from a second side of the semiconductor substrate to expose a surface. The second side is opposite to the first side. An interconnect layer is formed on the exposed surface.

In some implementations, after removing the carrier substrate, the stop layer is further removed from the second side of the semiconductor substrate to expose the surface.

In some implementations, to form the interface layer, an insulation layer is formed over the semiconductor substrate, a carbon-doped silicon nitride layer is formed over the insulation layer, and a single crystalline silicon layer is formed over the carbon-doped silicon nitride layer.

In some implementations, a thickness of the interface layer is between 1 μm and 10 μm.

In some implementations, a portion of the semiconductor channel further away from the interface layer than the channel plug is doped.

In some implementations, local contacts vertically adjacent to the channel plugs and interface contacts vertically adjacent to the local contacts are formed. A plurality of interconnects are formed in the interface layer. The plurality of interconnects are electrically connected to the interface contacts and the local contacts.

In some implementations, to form the interface layer, the insulating layer, the carbon-doped silicon nitride layer, and the single crystalline silicon layer are etched until the interface contacts and the local contacts are exposed, and the interconnects are formed in the etched locations of the interface layer.

In some implementations, the plurality of interconnects include one or more TSV type of contacts.

In some implementations, a plurality of gate structures are formed over the interface layer.

In some implementations, the plurality of peripheral circuits are formed after forming the plurality of gate structures.

In some implementations, a doped semiconductor layer is formed between the filling layer and the interconnect layer. Each of the plurality of the interconnects is a portion of one of the plurality of peripheral circuits.

In some implementations, to form the interconnect layer, one or more interlayer dielectric (ILD) layers are formed over the doped semiconductor layer, and one or more contacts and a redistribution layer are formed in the interconnect layer. The one or more contacts include source contacts.

In some implementations, the thickness of the support substrate is at least 300 μm.

According to still another aspect of the present disclosure, a system includes a 3D memory device configured to store data and a memory controller coupled to the 3D memory device and configured to control the 3D memory device. The 3D memory device includes a first semiconductor structure, a second semiconductor structure opposite to the first semiconductor structure, and an interface layer between the first semiconductor structure and the second semiconductor structure. The first semiconductor structure includes a memory stack having a plurality of interleaved stack conductive layers and stack dielectric layers. The second semiconductor structure includes a plurality of peripheral circuits electrically connected to the memory stack. The interface layer includes single crystalline silicon and a plurality of interconnects between the memory stack and the peripheral circuits.

In some implementations, the system further includes a host coupled to the memory controller and configured to send or receive the data.

In some implementations, the interface layer further includes an insulation layer, a carbon-doped silicon nitride layer, and a single crystalline silicon layer, and the insulation layer, the carbon-doped silicon nitride layer, and the single crystalline silicon layer are disposed sequentially from the first semiconductor structure to the second semiconductor structure.

In some implementations, the first semiconductor structure further includes a channel structure extending through the memory stack. The channel structure includes a memory film, a semiconductor channel, and a channel plug. Each of the plurality of the interconnects is a portion of a peripheral circuit. The peripheral circuit is further electrically connected to the channel structure through the channel plug, a channel local contact and the interconnect of the peripheral circuit.

In some implementations, the semiconductor channel further includes a doped portion that is further away from the interface layer than the channel plug.

In some implementations, the stack conductive layers include a source select gate laterally facing the doped portion.

In some implementations, the 3D memory device further includes a filling layer between the memory stack and a doped semiconductor layer.

In some implementations, the plurality of interconnects include one or more TSV type of contacts.

In some implementations, a thickness of the interface layer is between 1 µm and 10 µm.

In some implementations, a side of the second semiconductor structure facing away from the interface layer is attached to a support substrate.

In some implementations, the thickness of the support substrate is at least 300 µm.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a first semiconductor structure comprising a memory stack having a plurality of interleaved stack conductive layers and stack dielectric layers;
   a second semiconductor structure opposite to the first semiconductor structure, the second semiconductor structure comprising a plurality of peripheral circuits electrically connected to the memory stack; and
   an interface layer between the first semiconductor structure and the second semiconductor structure, the interface layer comprising single crystalline silicon and a plurality of interconnects between the memory stack and the peripheral circuits.

2. The 3D memory device of claim 1, wherein the interface layer further comprises an insulation layer, a carbon-doped silicon nitride layer, and a single crystalline silicon layer, and
   wherein the insulation layer, the carbon-doped silicon nitride layer, and the single crystalline silicon layer are disposed sequentially from the first semiconductor structure to the second semiconductor structure.

3. The 3D memory device of claim 1, wherein the first semiconductor structure further comprises:
   a channel structure extending through the memory stack, the channel structure comprising a memory film, a semiconductor channel, and a channel plug,
   wherein each of the plurality of the interconnects is a portion of a peripheral circuit, and
   wherein the peripheral circuit is further electrically connected to the channel structure through the channel plug, a channel local contact and the interconnect of the peripheral circuit.

4. The 3D memory device of claim 1, wherein the semiconductor channel further comprises a doped portion that is further away from the interface layer than the channel plug.

5. The 3D memory device of claim 4, wherein the stack conductive layers comprise a source select gate laterally facing the doped portion.

6. The 3D memory device of claim 1, further comprising a filling layer between the memory stack and a doped semiconductor layer.

7. The 3D memory device of claim 1, wherein the plurality of interconnects comprise one or more through-silicon via (TSV) type of contacts.

8. The 3D memory device of claim 1, wherein a thickness of the interface layer is between 1 µm and 10 µm.

9. The 3D memory device of claim 1, wherein a side of the second semiconductor structure facing away from the interface layer is attached to a support substrate.

10. The 3D memory device of claim 9, wherein the thickness of the support substrate is at least 300 µm.

11. A method for forming a three-dimensional (3D) memory device, comprising:
    providing a semiconductor substrate comprising a carrier substrate, a stop layer, and a filling layer;
    forming a memory stack and a plurality of channel structures extending through the memory stack in the semiconductor substrate, each channel structure comprising a memory film, a semiconductor channel, and a channel plug;
    forming an interface layer over the semiconductor substrate, the interface layer comprising single crystalline silicon;
    forming a plurality of peripheral circuits over the interface layer, the peripheral circuits being electrically connected to the memory stack;
    bonding a support substrate to the semiconductor substrate from a first side;

removing the carrier substrate from a second side of the semiconductor substrate to expose a surface, the second side being opposite to the first side; and forming an interconnect layer on the exposed surface.

12. The method of claim 11, wherein, after removing the carrier substrate, the stop layer is further removed from the second side of the semiconductor substrate to expose the surface.

13. The method of claim 11, wherein forming the interface layer further comprises:
   forming an insulation layer over the semiconductor substrate,
   forming a carbon-doped silicon nitride layer over the insulation layer, and
   forming a single crystalline silicon layer over the carbon-doped silicon nitride layer.

14. The method of claim 11, wherein a portion of the semiconductor channel further away from the interface layer than the channel plug is doped.

15. The method of claim 11, further comprising:
   forming local contacts vertically adjacent to the channel plug and interface contacts vertically adjacent to the local contacts, and
   forming a plurality of interconnects in the interface layer, the plurality of interconnects being electrically connected to the interface contacts and the local contacts.

16. The method of claim 15, wherein forming the interface layer further comprises:
   etching the insulating layer, the carbon-doped silicon nitride layer, and the single crystalline silicon layer until the interface contacts and the local contacts are exposed, and
   forming the interconnects in the etched locations of the interface layer.

17. The method of claim 11, further comprising forming a plurality of gate structures over the interface layer.

18. The method of claim 17, further comprising forming the plurality of peripheral circuits after forming the plurality of gate structures,
   wherein each of the plurality of interconnects is a portion of one of the plurality of peripheral circuits.

19. A system, comprising:
   a three-dimensional (3D) memory device configured to store data, the 3D memory device comprising:
      a first semiconductor structure comprising a memory stack having a plurality of interleaved stack conductive layers and stack dielectric layers;
      a second semiconductor structure opposite to the first semiconductor structure, the second semiconductor structure comprising a plurality of peripheral circuits electrically connected to the memory stack; and
      an interface layer between the first semiconductor structure and the second semiconductor structure, the interface layer comprising single crystalline silicon and a plurality of interconnects between the memory stack and the peripheral circuits; and
   a memory controller coupled to the 3D memory device and configured to control the 3D memory device.

20. The system of claim 19, further comprising a host coupled to the memory controller and configured to send or receive the data.

* * * * *